United States Patent
Hosokawa et al.

(10) Patent No.: US 8,639,068 B2
(45) Date of Patent: Jan. 28, 2014

(54) OPTICAL TRANSMISSION MODULE, ELECTRONIC INSTRUMENT, METHOD FOR ASSEMBLING OPTICAL TRANSMISSION MODULE, AND OPTICAL TRANSMISSION METHOD

(75) Inventors: Hayami Hosokawa, Tsuzuki-gun (JP); Naru Yasuda, Uji (JP); Kentaro Hamana, Kusatsu (JP)

(73) Assignee: OMRON Corporation, Kyoto-shi, Kyoto (JP)

( * ) Notice: Subject to any disclaimer, the term of this patent is extended or adjusted under 35 U.S.C. 154(b) by 357 days.

(21) Appl. No.: 12/953,349

(22) Filed: Nov. 23, 2010

(65) Prior Publication Data

US 2011/0135249 A1  Jun. 9, 2011

(30) Foreign Application Priority Data

Dec. 7, 2009 (JP) ................................. 2009-277936

(51) Int. Cl.
*G02B 6/12* (2006.01)

(52) U.S. Cl.
USPC ................... 385/14; 385/15; 385/31; 385/32; 385/47; 385/50; 385/51; 385/52; 385/115; 385/119; 398/132; 398/134; 398/138; 398/139; 398/140; 398/141; 398/142; 264/1.24; 264/1.29

(58) Field of Classification Search
USPC ............... 385/14–15, 31–32, 47, 50–52, 115, 385/119; 398/132, 134, 138–142; 264/1.24; 264/1.29
See application file for complete search history.

(56) References Cited

U.S. PATENT DOCUMENTS

| 7,136,543 | B2* | 11/2006 | Nishiyama et al. | 385/14 |
| 7,184,617 | B2* | 2/2007 | Korenaga et al. | 385/14 |
| 7,496,266 | B2* | 2/2009 | Enami et al. | 385/130 |
| 7,551,829 | B2* | 6/2009 | Enami et al. | 385/141 |
| 7,731,430 | B2* | 6/2010 | Ohtsu et al. | 385/88 |
| 8,078,022 | B2* | 12/2011 | Hamana et al. | 385/32 |
| 2008/0152286 | A1 | 6/2008 | Ueno et al. | |
| 2009/0103858 | A1* | 4/2009 | Ohtsu et al. | 385/14 |

FOREIGN PATENT DOCUMENTS

| JP | 2005-252334 | | 9/2005 |
| JP | 2006042307 | A | 2/2006 |
| JP | 2006-310643 | | 11/2006 |
| JP | 2008170903 | A | 7/2008 |
| JP | 2009-194179 | | 8/2009 |
| KR | 10-2008-0059018 | A | 6/2008 |
| WO | 2009096067 | A1 | 8/2009 |
| WO | 2009125735 | A1 | 10/2009 |

OTHER PUBLICATIONS

Mechanical English Abstract of Japanese Patent Application with Publication No. 2006-310643, Publication Date: Nov. 9, 2006, 1 page.
Mechanical English Abstract for Japanese Patent Application with Publication No. 2009-194179, Publication Date: Aug. 27, 2009, 1 page.
Mechanical English translation of Japanese Patent Application with Publication No. 2005-252334, Publication Date: Sep. 15, 2005, 30 pages.
Office Action for Korean Patent Application No. 10-2010-12299 mailed Mar. 14, 2011, with English translation thereof (8 pages).
Extended European Search Report Issued in European Application No. 10191934.8; Dated: Oct. 23, 2013 (7 pages).

* cited by examiner

*Primary Examiner* — Ryan Lepisto
*Assistant Examiner* — Guy Anderson
(74) *Attorney, Agent, or Firm* — Osha Liang LLP

(57) ABSTRACT

An optical transmission module has an optical transmission path in which optical transmission is performed between a first circuit board and a second circuit board disposed opposite the first circuit board. The optical transmission path has a folded structure having a bending radius. A circumferential portion drawn by the bending radius is provided substantially perpendicular to board surfaces of the first circuit board and the second circuit board.

14 Claims, 18 Drawing Sheets

Fig. 3
(a)
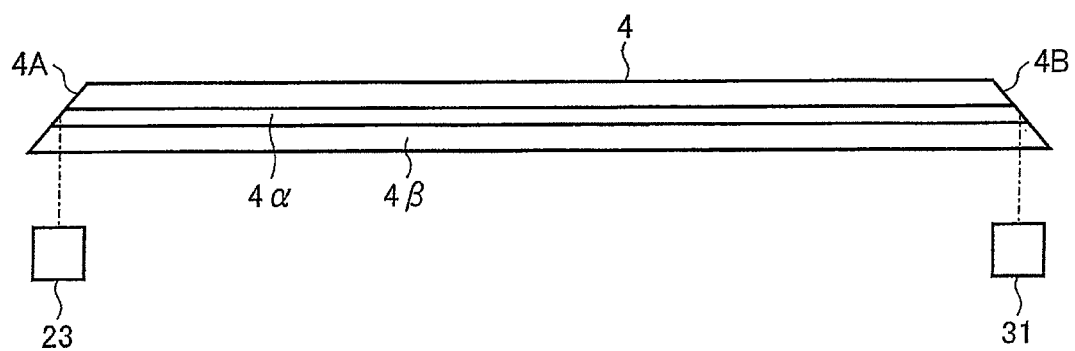
(b)
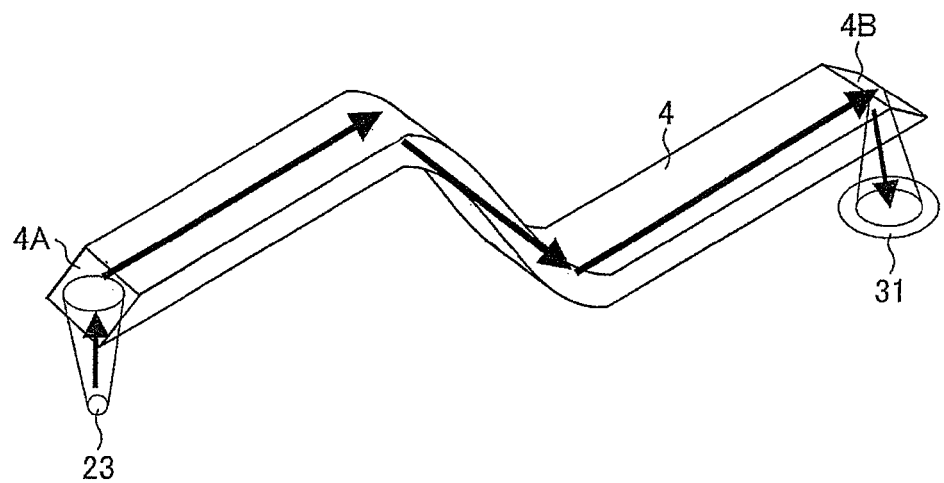

Fig. 8
(a)
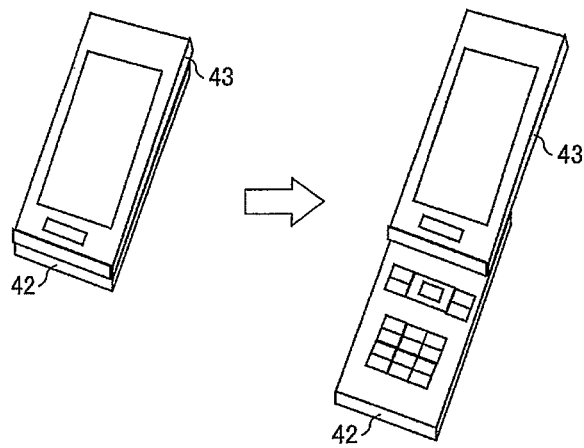
(b)
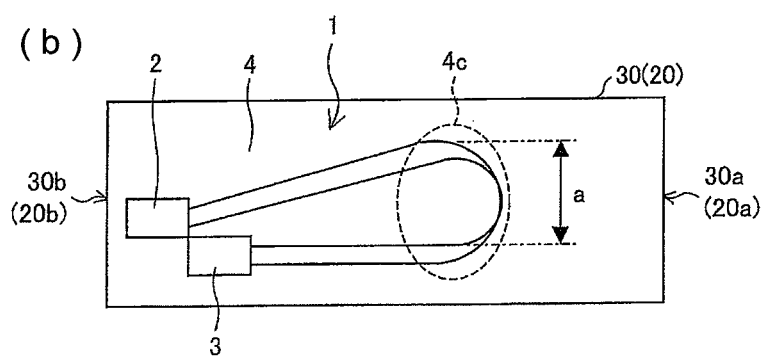
(c)
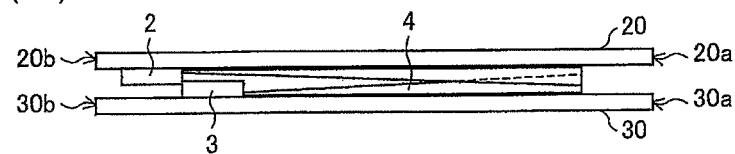
(d)
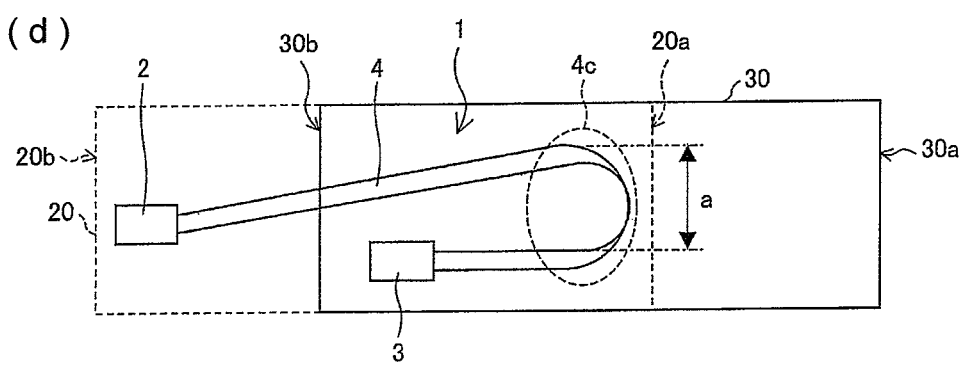

Fig. 9
(a)
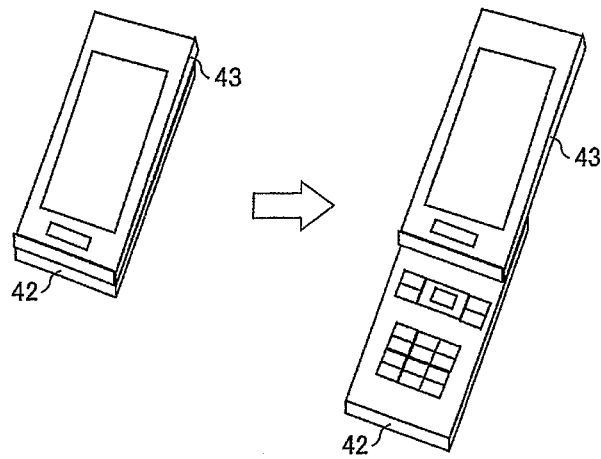
(b)
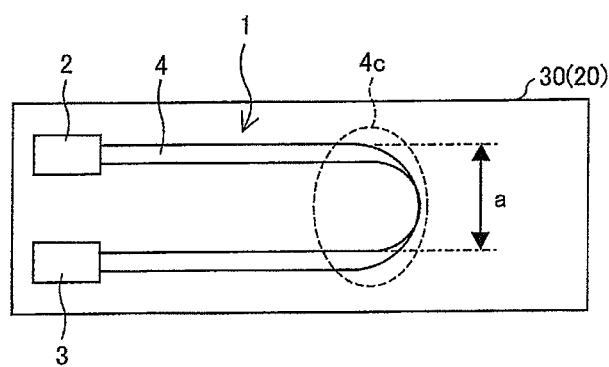
(c)
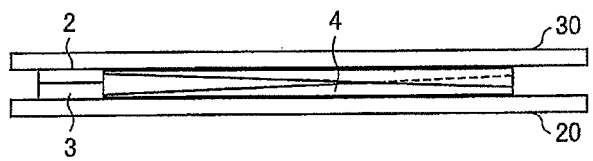
(d)
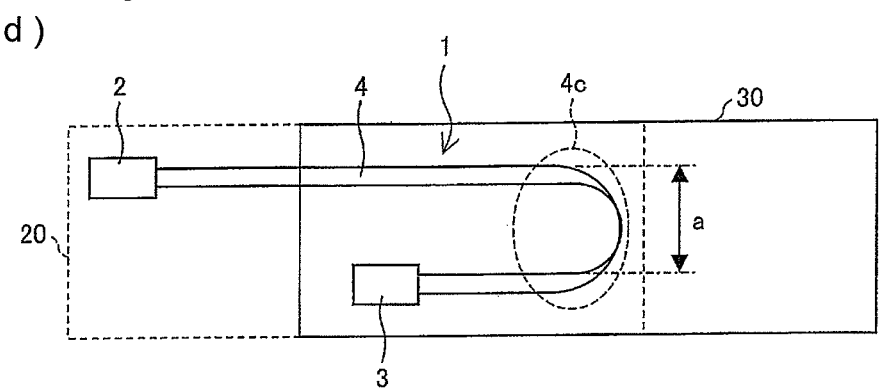

Fig. 10
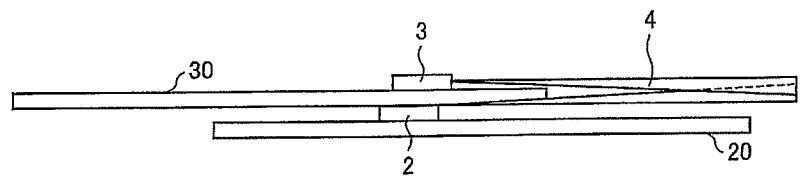
Fig. 11
(a)
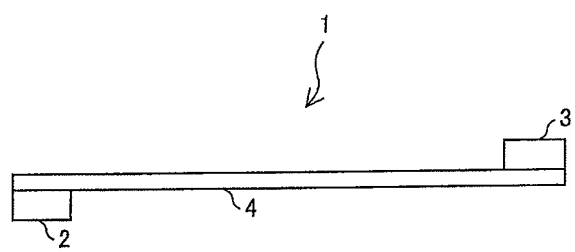
(b)
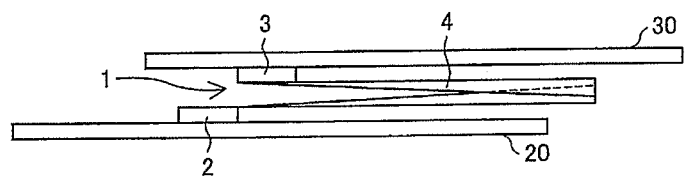
(c)
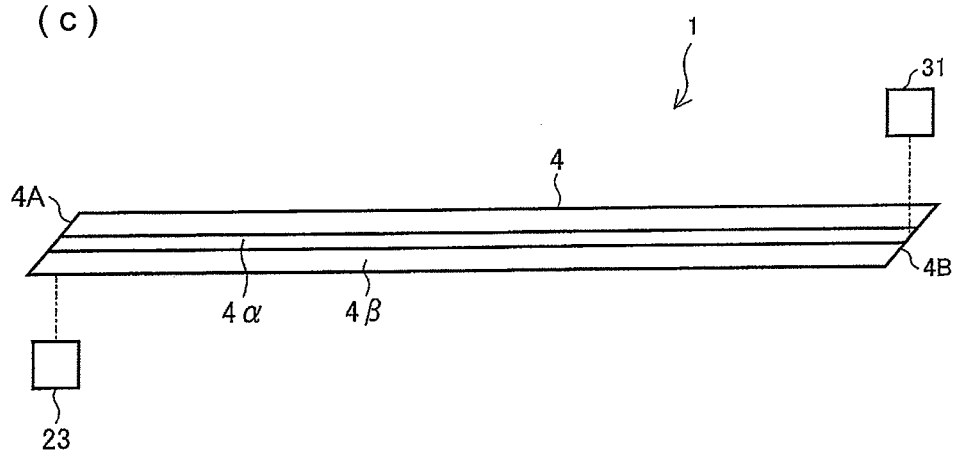

Fig. 19
(a)
Board to Board connector connection
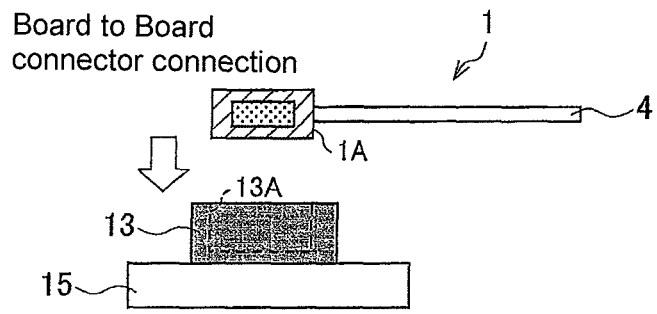
(b)
ZIF connector connection
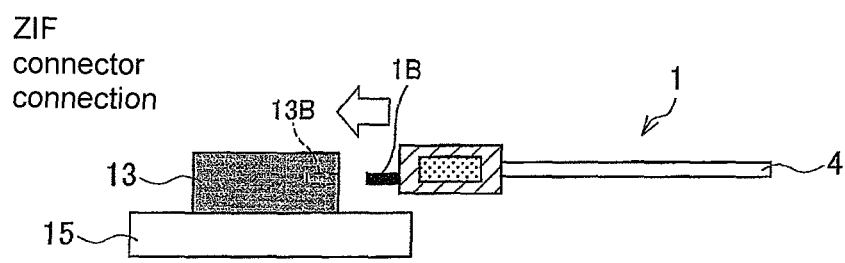
(c)
ACF joining
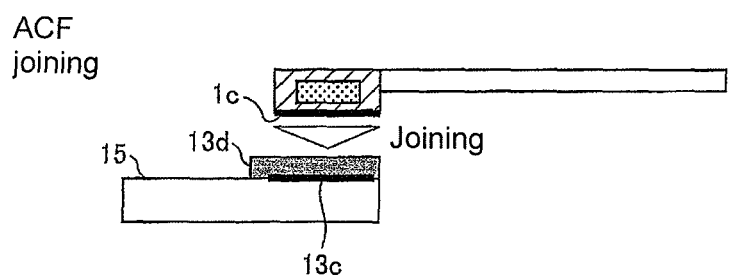
(d)
Optical connection method
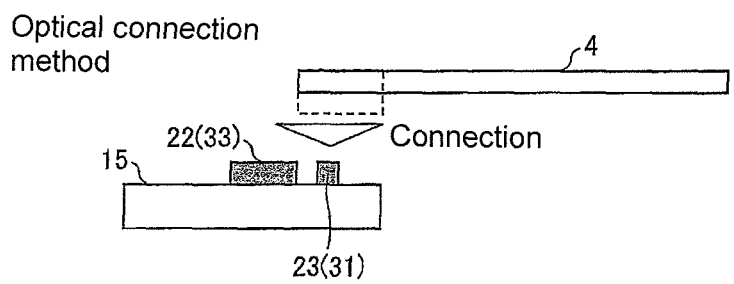

Fig. 20
(a) 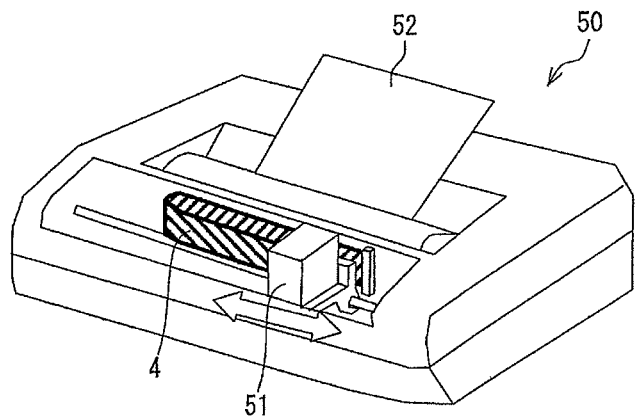
(b) 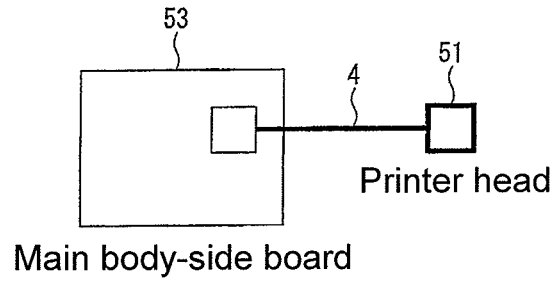
Main body-side board   Printer head
(c) 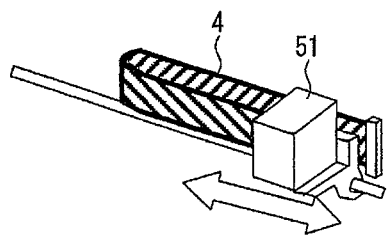
(d) 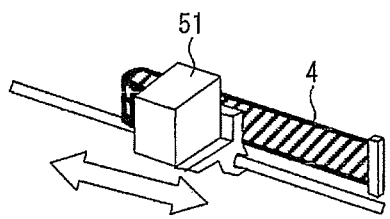

(a)

| Distance between circuit boards | Bending shape | Number of slides | Number of n | Result |
|---|---|---|---|---|
| 1.5mm | U-shape | 100000 | 5 | 5/5 WG fracture: NG |
| 1.5mm | Twisting bending | 250000 | 3 | 3/3 Normal appearance |

(b)

OPTICAL TRANSMISSION MODULE, ELECTRONIC INSTRUMENT, METHOD FOR ASSEMBLING OPTICAL TRANSMISSION MODULE, AND OPTICAL TRANSMISSION METHOD

TECHNICAL FIELD

The present invention relates to an optical transmission module, an electronic instrument, a method for assembling the optical transmission module, and an optical transmission method.

BACKGROUND ART

Recently, with a finer LCD (Liquid Crystal Display) of a mobile telephone, there is a demand for enhancement of a data transmission speed between the LCD and an application processor. In the data transmission wiring between circuit boards, there is also a demand for reduction of the number of wirings or a high bending property as a low profile of the mobile telephone progresses. Particularly, in a sliding type mobile telephone including a sliding mechanism that moves two circuit boards in parallel, it is necessary to generate wiring bending in a space (a distance between circuit boards is less than 3 mm) formed between the circuit boards. Therefore, in the sliding type mobile telephone, there is the noticeable demand for the high bending property of the wiring.

Conventionally, a flexible printed circuit (FPC) board is used to connect the circuit boards in the sliding type mobile telephone. For example, Patent Documents 1 and 2 disclose techniques of connecting the circuit boards using the flexible printed circuit board.

Patent Document 1 discloses a flexible printed circuit board whose outside resin film has an elastic modulus of 6 GP or more. The flexible printed circuit board is provided in an outside insulating layer that becomes an outside during bending. Therefore, a bending-resistant property of the flexible printed circuit board is improved to prevent disconnection of a conductive circuit constituting a conductive circuit layer, even if the flexible printed circuit board is repeatedly bent in one direction. In the technique disclosed in Patent Document 2, a thickness, the elastic modulus, a sliding radius and the like are defined for each of a plurality of layers (such as an electrically insulating layer, bonding agent layer, and a conductive layer) constituting the flexible printed circuit board, thereby improving the bending-resistant property of the flexible printed circuit board. In the techniques disclosed in Patent Documents 1 and 2, repeated bending durability is improved by controlling the elastic modulus and thickness of the resin material layer in the flexible printed circuit board.

Separately of the connection between the circuit boards using the flexible printed board, there has been tried a method for connecting the LCD and the application processor using an optical transmission path such as an optical waveguide to transmit a data signal as an optical signal.

The optical waveguide has a double structure in which a center called a core is coated with a casing called a clad, and a refractive index of the core is higher than that of the clad. Therefore, the optical signal incident to the core is propagated by repeating total reflection in the core.

For example, using an optical transmission module, the high-speed, large-capacity data signal can be transmitted to an application circuit board from a main control board mounted in the mobile telephone. The optical transmission module is excellent as a data transmission module.

For example, Patent Document 3 discloses a technique of applying the optical transmission module to the mobile telephone. In the optical transmission module disclosed in Patent Document 3, a plurality of mirrors that deflect light at substantially 90° are disposed between a light emitting element and a light receiving element, and a plurality of optical transmission paths are provided between the light emitting element and the mirror, between the plurality of mirrors, and between the light receiving element and the mirror. With this configuration, the optical transmission module can be rotated about a plurality of rotating axes, and bending is not generated in the optical transmission path. Therefore, an optical loss caused by the bending of the optical transmission path can be avoided to realize the mobile telephone that can deal with various operations such as the rotation.

Patent Document 1: Japanese Unexamined Patent Publication No. 2006-310643 (published on Nov. 9, 2006)
Patent Document 2: Japanese Unexamined Patent Publication No. 2009-194179 (published on Aug. 27, 2009)
Patent Document 3: Japanese Unexamined Patent Publication No. 2005-252334 (published on Sep. 15, 2005)

SUMMARY

In sliding type electronic instruments such as a sliding type mobile telephone, a low-profile sliding mechanism that moves the two circuit boards in parallel is developed to achieve the further low profile. As the low profile of the sliding mechanism progresses, a distance between the two circuit boards is shortened, and the demand for the bending property of the data transmission wiring between the boards becomes increasingly strict.

In the techniques disclosed in Patent Documents 1 and 2, the repeated bending durability is improved by controlling the elastic modulus and thickness of the resin material layer in the flexible printed circuit board. However, in the flexible printed circuit board dedicated to the bending, it is necessary to establish impedance matching between the boards, and it is difficult to establish a balance between the bending property and a transmission characteristic for data transmission. Even if optical wiring is applied to the techniques disclosed in Patent Documents 1 and 2, it is not necessary to establish the impedance matching.

When the techniques disclosed in Patent Documents 1 and 2 are applied to the optical transmission module, a bending limit radius of the optical transmission path restricts the low profile of the sliding type mobile telephone, and unfortunately the low profile can insufficiently be achieved. FIG. 23 is a side view illustrating a configuration in which the techniques disclosed in Patent Documents 1 and 2 are applied to the optical transmission module.

As illustrated in FIG. 23, when the techniques disclosed in Patent Documents 1 and 2 are applied to the optical transmission module, an optical transmission path 4' is bent into a U-shape from a transmission-side board 20 toward a reception-side board 30. Therefore, a bending radius of the optical transmission path 4' is set such that bending radius×2 (bending diameter a) is lower than a board-to-board distance d. That is, in the configuration illustrated in FIG. 23, the board-to-board distance d cannot be set so as to be lower than the bending diameter a of the optical transmission path 4. Therefore, the board-to-board distance d cannot be set so as to be lower than a limit bending radius×2, even if the bending radius of the optical transmission path 4' is set to the limit bending radius of a lower limit at which the bending-resistant property is maintained in order to achieve the low profile.

Accordingly, when the techniques disclosed in Patent Documents 1 and 2 are applied to the optical transmission module, the bending limit radius of the optical transmission path 4' restricts the low profile of the mobile telephone.

In the technique disclosed in Patent Document 3, the optical loss can be reduced because the bending is not generated in the optical transmission path. However, cost increases because an optical path is converted by a combination of the plurality of mirrors in order to avoid the bending of the optical transmission path.

One or more embodiments of the present invention provides an optical transmission module in which, even if the board-to-board distance is lower than the bending resistance limit of the optical transmission path (bending-resistant property cannot be maintained), the optical transmission path can be accommodated within the distance to achieve the narrow accommodation space, an electronic instrument, a method for assembling the optical transmission module, and an optical transmission method.

An optical transmission module according to one or more embodiments of the present invention including an optical transmission path in which optical transmission is performed between a first circuit board and a second circuit board, the first circuit board and the second circuit board being disposed opposite to each other, wherein the optical transmission path has a folded structure having a bending radius R, and a circumferential portion drawn by the bending radius R is provided substantially perpendicular to board surfaces of the first circuit board and the second circuit board.

According to the above configuration, the optical transmission path has the folded structure having the bending radius R, and the circumferential portion drawn by the bending radius R is provided substantially vertical to the board surfaces of the first circuit board and the second circuit board, so that the bending radius R can be set to any radius irrespective of the board-to-board distance between the first circuit board and the second circuit board. Accordingly, with the above configuration, even if the board-to-board distance is lower than the bending resistance limit of the optical transmission path (the bending-resistant property cannot be maintained), the optical transmission path can be accommodated within the distance to achieve the narrow accommodation space, and therefore the further low profile of the electronic instrument can be achieved. It is not always necessary that the whole circumferential portion be substantially vertically provided, but it is only necessary that at least part of the circumferential portion be provided vertically to the board surfaces of the first circuit board and the second circuit board.

The optical transmission module according to one or more embodiments of the present invention includes: an optical transmission unit that is connected to the first circuit board; and an optical reception unit that is connected to the second circuit board, wherein the optical transmission path is twisted about an optical transmission direction, and the optical transmission unit and the optical reception unit are connected to the first circuit board and the second circuit board while the optical transmission path is twisted.

According to the above configuration, the optical transmission path is twisted about the optical transmission direction, and the optical transmission unit and the optical reception unit are connected to the first circuit board and the second circuit board while the optical transmission path is twisted. Therefore, the bending portion of the optical transmission path is twisted by twisting the optical transmission path about the optical transmission direction. A bending direction of the bending portion is changed by the twist. As a result, according to the above configuration, the bending portion of the optical transmission path is bent in a direction along the board surfaces of the first circuit board and the second circuit board. That is, the optical transmission path is provided substantially vertical to the board surfaces, so that the bending radius of the bending portion can be set to any radius irrespective of the board-to-board distance between the first circuit board and the second circuit board. Accordingly, with the above configuration, even if the board-to-board distance is lower than the bending resistance limit of the optical transmission path (the bending-resistant property cannot be maintained), the optical transmission path can be accommodated within the distance to realize the narrow accommodation space, and therefore the further low profile of the electronic instrument can be achieved.

In the optical transmission module according to one or more embodiments of the present invention, the optical reception unit is provided in a surface opposite to a surface in which the optical transmission unit is provided in the optical transmission path.

With the above configuration, the twist is naturally generated in the optical transmission path when the optical transmission module is mounted on the first circuit board and second circuit board that are disposed opposite to each other. Therefore, according to the above configuration, the board-to-board distance between the first circuit board and the second circuit board can easily be shortened.

In the optical transmission module according to one or more embodiments of the present invention, the first circuit board and the second circuit board are relatively moved in parallel with each other.

Therefore, the optical transmission module according to one or more embodiments of the present invention can suitably be used in the sliding type electronic instruments such as the sliding type mobile telephone in which the first circuit board and the second circuit board are moved in parallel with each other.

In the optical transmission module according to one or more embodiments of the present invention, at least a width of a bending portion in the optical transmission path is smaller than a distance between the first circuit board and the second circuit board.

As described above, in the optical transmission module according to one or more embodiments of the present invention, the optical transmission path is not bent into the U-shape from the first circuit board toward the second circuit board by the twist, but the optical transmission path is twisted and bent along the board surfaces of the first circuit board and the second circuit board. As a result, the bending portion of the optical transmission path is disposed such that the bending surface is substantially vertical to the board surface, and therefore the board-to-board distance is determined by a width of the optical transmission path.

With the above configuration, because at least the width of the bending portion in the optical transmission path becomes lower than the distance between the first circuit board and the second circuit board, the low profile of the electronic instrument is effectively achieved.

In the optical transmission module according to one or more embodiments of the present invention, a board film made of a material different from a material used in the optical transmission path is provided in one of a plurality of surfaces parallel to an optical transmission direction in the optical transmission path.

The above configuration can realize the optical transmission module in which durability of tension and wear-out of the optical transmission path is improved during the repeated bending.

In the optical transmission module according to one or more embodiments of the present invention, the board film is provided in a surface that becomes an outside during bending in the optical transmission path.

According to one or more embodiments of the present invention, board film has a characteristic in which the board film is easily fractured by the repeated bending while the fracture caused by the tension of the optical transmission path can be prevented. The bending-resistant property of the optical transmission path can be improved by providing such an easy-to-fracture board film in the surface that becomes the outside during the bending in the optical transmission path.

The optical transmission module according to one or more embodiments of the present invention includes: an optical transmission unit that is connected to the first circuit board; and an optical reception unit that is connected to the second circuit board, wherein the optical transmission unit includes a light emitting element that emits light to the optical transmission path, the optical reception unit includes a light receiving element that receives light transmitted in the optical transmission path, the light receiving element is disposed on a side on which the board film is provided in the optical transmission path, and the light emitting element is disposed on a side on which the board film is not provided in the optical transmission path.

With the above configuration, the board film is not interposed between the light emitting element-optical transmission path in which an optical coupling loss changes greatly according to an optical coupling distance, but the board film is interposed between the light receiving element-optical transmission path in which the small change of the optical coupling loss is generated according to the optical coupling distance, so that the optical loss can be reduced in the whole optical transmission module. Accordingly, output of the light emitted from the light emitting element can be reduced and a current inputted to the light emitting element can also be reduced. Therefore, according to the above configuration, power consumption of the optical transmission module can be reduced.

According to one or more embodiments of the present invention, an optical transmission module comprises: an electric transmission path in which an electric signal is transmitted between a first circuit board and a second circuit board; an optical transmission unit that is mounted on the electric transmission path; an optical transmission path that is optically coupled to the optical transmission unit; and an optical reception unit that is mounted on a surface identical to that of the optical transmission unit in the electric transmission path and optically coupled to the optical transmission path, wherein the optical transmission path is mounted while twisted about an optical transmission direction.

In the optical transmission module integrated with the electric transmission path, when the optical transmission path is bent into the U-shape, the bending radius of the electric transmission path can be reduced to a radius that substantially coincides with the bending limit radius of the optical transmission path. However, at this time, because most of an area of the optical transmission path is in contact with the electric transmission path, a mechanical load caused by friction with the electric transmission path is generated in the optical transmission path in addition to a stress caused by the bending. In the optical transmission path in which the stress is generated near the bending portion bent with the bending limit radius, when a breakage is generated by the friction with the electric wiring, the fracture may be generated from the breakage.

On the other hand, when the optical transmission path is twisted about the optical transmission direction as in the above configuration, a contact area between the optical transmission path and the electric transmission path becomes smaller than that of the case where the optical transmission path is bent into the U-shape. Therefore, the mechanical load caused by the friction with the electric transmission path can be reduced, and the breakage caused by the friction can also be reduced. The bending radius of the optical transmission path is arbitrarily set, so that the stress caused by the bending can be released.

An electronic instrument according to one or more embodiments of the present invention includes: the above-mentioned optical transmission module; and a first circuit board and a second circuit board that are disposed opposite to each other.

Therefore, even if the board-to-board distance is lower than the bending resistance limit of the optical transmission path (the bending-resistant property cannot be maintained), the optical transmission path can be accommodated within the distance to achieve the narrow accommodation space, and therefore the further low profile of the electronic instrument can be achieved.

Further, the electronic instrument according to one or more embodiments of the present invention includes a sliding mechanism that relatively moves the first circuit board and the second circuit board in parallel with each other.

Therefore, the optical transmission module according to one or more embodiments of the present invention can suitably be used in the sliding type electronic instruments such as the sliding type mobile telephone in which the first circuit board and the second circuit board are moved in parallel with each other.

Further, the electronic instrument according to one or more embodiments of the present invention includes a guide unit, which guides bending of the optical transmission path, in any one of board surfaces of the first circuit board and the second circuit board, wherein the guide unit is provided while extending in a direction perpendicular to the board surface.

Therefore, the bending portion of the optical transmission path can be provided at the fixed position, and the bending of the optical transmission path can stably be maintained.

In the electronic instrument according to one or more embodiments of the present invention, the optical transmission module may include: an optical transmission unit that is connected to the first circuit board; and an optical reception unit that is connected to the second circuit board, horizontal connector projections that are projected in an optical transmission direction of the optical transmission path are formed in the optical transmission unit and the optical reception unit, and first fitting units that are fitted in the horizontal connector projections are formed in the first circuit board and the second circuit board.

Further, in the electronic instrument according to one or more embodiments of the present invention, the optical transmission module may include: an optical transmission unit that is connected to the first circuit board; and an optical reception unit that is connected to the second circuit board, headers of perpendicular connectors that are projected perpendicular to the optical transmission direction of the optical transmission path are formed in the optical transmission unit and the optical reception unit, and second fitting units that are fitted in the headers are formed in the first circuit board and the second circuit board.

Further, in the electronic instrument according to one or more embodiments of the present invention, the optical transmission module may include: an optical transmission unit that is connected to the first circuit board; and an optical reception unit that is connected to the second circuit board, first circuit patterns are formed in the optical transmission unit and the optical reception unit, second circuit patterns are formed in the first circuit board and the second circuit board, and the first and second circuit patterns are connected through an anisotropic conductive film.

In the electronic instrument according to one or more embodiments of the present invention, the optical transmission module includes: an optical transmission unit that is connected to the first circuit board; and an optical reception unit that is connected to the second circuit board, and as to the first circuit board and the second circuit board, when a position at which both end portions in a direction of movement performed by the sliding mechanism are overlapped is set to a closed position, a position, at which the first circuit board and the second circuit board are relatively moved in parallel with each other from the closed position and one of end portions in the moving direction of the first circuit board is brought closest to the other end portion in the moving direction of the second circuit board, is set to an opened position, and a position between the closed position and the opened position is set to an intermediate position, the optical transmission unit and the optical reception unit are disposed so as not to be overlapped with each other at any one of the closed position, the opened position, and the intermediate position when viewed from a direction normal to the first circuit board and the second circuit board.

With the above configuration, the optical transmission unit and the optical reception unit are disposed so as not to be overlapped with each other at any one of the closed position, the opened position, and the intermediate position when viewed from the direction normal to the first circuit board and the second circuit board, so that the board-to-board distance can be set lower than the sum of the thicknesses of the optical transmission unit and optical reception unit in the normal direction, and the further low-profile electronic instrument can be realized.

In the electronic instrument according to one or more embodiments of the present invention, a distance between the optical transmission unit and the optical reception unit is twice or less a bending radius of the optical transmission path when viewed from a direction normal to the first circuit board and the second circuit board.

Therefore, an occupied area of the optical transmission module can be reduced in the electronic instrument.

A method according to one or more embodiments of the present invention for assembling an optical transmission module includes an optical transmission unit, an optical transmission path optically coupled to the optical transmission unit, and an optical reception unit optically coupled to the optical transmission path, the optical transmission module assembling method including: arraying the optical transmission unit and the optical reception unit in an optical transmission direction of the optical transmission path; and mounting the optical transmission path in the optical transmission unit and the optical reception unit while the optical transmission path is twisted.

Therefore, the optical transmission module can be assembled to reduce the production cost using the same equipment for the usual optical transmission module in which the optical transmission unit and the optical reception unit are disposed in the same surface as the optical transmission path.

An optical transmission method according to one or more embodiments of the present invention has optical transmission performed between a first circuit board and a second circuit board using an optical transmission path, the first circuit board and the second circuit board being disposed opposite to each other, the optical transmission method including: disposing an optical transmission unit and an optical reception unit in the first circuit board and the second circuit board, respectively; mounting the optical transmission path in the optical transmission unit and the optical reception unit while the optical transmission path is twisted; and receiving an optical signal, transmitted from the optical transmission unit, with the optical reception unit.

With the above configuration, even if the board-to-board distance is lower than the bending resistance limit of the optical transmission path (the bending-resistant property cannot be maintained), the optical transmission path can be accommodated within the distance to realize the narrow accommodation space.

As described above, the optical transmission module according to one or more embodiments of the present invention includes the optical transmission path in which the optical transmission is performed between the first circuit board and the second circuit board, which are disposed opposite to each other, the optical transmission path has the folded structure having the bending radius R, and the circumferential portion drawn by the bending radius R is provided substantially vertical to the board surfaces of the first circuit board and the second circuit board.

As described above, the optical transmission module according to one or more embodiments of the present invention includes: the electric transmission path in which the electric signal is transmitted between the first circuit board and the second circuit board; the optical transmission unit that is mounted on the electric transmission path; the optical transmission path that is optically coupled to the optical transmission unit; and the optical reception unit that is mounted on the same surface as the optical transmission unit of the electric transmission path and optically coupled to the optical transmission path. In the optical transmission module, the optical transmission path is mounted while twisted about the optical transmission direction.

As described above, the electronic instrument according to one or more embodiments of the present invention includes the optical transmission module; and the first circuit board and the second circuit board that are disposed opposite to each other.

As described above, the method according to one or more embodiments of the present invention is the method for assembling the optical transmission module that includes the optical transmission unit, the optical transmission path optically coupled to the optical transmission unit, and the optical reception unit optically coupled to the optical transmission path, and the optical transmission module assembling method includes: arraying the optical transmission unit and the optical reception unit in the optical transmission direction of the optical transmission path; and mounting the optical transmission path in the optical transmission unit and the optical reception unit while the optical transmission path is twisted.

As described above, the optical transmission method according to one or more embodiments of the present invention is the method in which optical transmission is performed between the first circuit board and the second circuit board using the optical transmission path, the first circuit board and the second circuit board being disposed opposite to each other, and the optical transmission method includes: disposing the optical transmission unit and the optical reception unit in the first circuit board and the second circuit board, respectively; mounting the optical transmission path in the optical transmission unit and the optical reception unit while the optical transmission path is twisted; and receiving the optical signal, transmitted from the optical transmission unit, with the optical reception unit.

Therefore, even if the board-to-board distance is lower than the bending resistance limit of the optical transmission path (the bending-resistant property cannot be maintained), the optical transmission path can be accommodated within the distance to realize the narrow accommodation space, and therefore the further low profile of the electronic instrument can be achieved.

BRIEF DESCRIPTION OF THE DRAWINGS

FIGS. 1(a) to 1(c) illustrate a schematic configuration of a sliding type mobile telephone in which an optical transmission module according to one or more embodiments of the present invention is incorporated, wherein FIG. 1(a) is a side sectional view of the mobile telephone, FIG. 1(b) is a top plan view of the mobile telephone, and FIG. 1(c) is a perspective view illustrating an appearance of the mobile telephone.

FIG. 3(a) is a side view of an optical transmission path, and FIG. 3(b) is a view schematically illustrating an optical transmission state in the optical transmission path.

FIGS. 5(a) and 5(b) illustrate a specific configuration of the optical transmission module, wherein FIG. 5(a) is a sectional view of the optical transmission module, and FIG. 5(b) is a sectional view illustrating a configuration of an optical transmission unit when a transmission-side contact unit has a connector connection structure.

FIGS. 8(a) to 8(d) illustrate an example of positions at which an optical transmission unit and an optical reception unit are mounted in the mobile telephone of FIGS. 1(a) to 1(c), wherein FIG. 8(a) is a perspective view for describing an opened position and a closed position in the mobile telephone, FIG. 8(b) is a top plan view illustrating the positions at which the optical transmission unit and the optical reception unit are mounted when the optical transmission unit and the optical reception unit are in the closed position, FIG. 8(c) is a side view illustrating the positions at which the optical transmission unit and the optical reception unit are mounted when the optical transmission unit and the optical reception unit are in the closed position, and FIG. 8(d) is a top plan view illustrating the positions at which the optical transmission unit and the optical reception unit are mounted when the optical transmission unit and the optical reception unit are in the opened position.

FIGS. 9(a) to 9(d) illustrate another example of the positions at which the optical transmission unit and the optical reception unit are mounted in the mobile telephone of FIGS. 1(a) to 1(c), wherein FIG. 9(a) is a perspective view for describing the opened position and the closed position in the mobile telephone, FIG. 9(b) is a top plan view illustrating the positions at which the optical transmission unit and the optical reception unit are mounted when the optical transmission unit and the optical reception unit are in the closed position, FIG. 9(c) is a side view illustrating the positions at which the optical transmission unit and the optical reception unit are mounted when the optical transmission unit and the optical reception unit are in the closed position, and FIG. 9(d) is a top plan view illustrating the positions at which the optical transmission unit and the optical reception unit are mounted when the optical transmission unit and the optical reception unit are in the opened position.

FIG. 10 is a side view illustrating an example of a configuration of the optical transmission module provided with an optical transmission path 4 of FIGS. 3(a) and 3(b).

FIGS. 11(a) to 11(c) illustrate a configuration of the optical transmission module, wherein FIG. 11(a) is a side view, FIG. 11(b) is a side view for describing the optical transmission module when the optical transmission module is mounted on a transmission-side circuit board and a reception-side circuit board, and FIG. 11(c) is a schematic diagram illustrating a positional relationship among an optical transmission path, a light emitting unit, and a light receiving unit in the optical transmission module.

FIGS. 16(a) to 16(c) illustrate a configuration of an optical transmission module according to Modification 2, wherein FIG. 16(a) is a top plan view, FIG. 16(b) is a side view, and FIG. 16(c) is an exploded perspective view.

FIGS. 19(a) to 19(d) are views illustrating a method for attaching the optical transmission module to an external wiring board, wherein FIGS. 19(a) to 19(d) are sectional views illustrating a disposition relationship among the optical transmission module, the external wiring board, and a connection retaining member.

FIG. 20(a) is a perspective view illustrating an appearance of a printing device provided with the optical transmission module according to one or more embodiments of the present invention, FIG. 20(b) is a block diagram illustrating a main part of the printing device of FIG. 20(a), and FIGS. 20(c) and 20(d) are perspective views illustrating a curved state of the optical transmission path when a printer head is moved (driven) in the printing device.

FIGS. 22(a) and 22(b) illustrate a sliding test performed in Example 1, wherein FIG. 22(a) is a table illustrating a result of the sliding test, and FIG. 22(b) is a view for describing a method for performing the sliding test.

DETAILED DESCRIPTION

Figure 1:
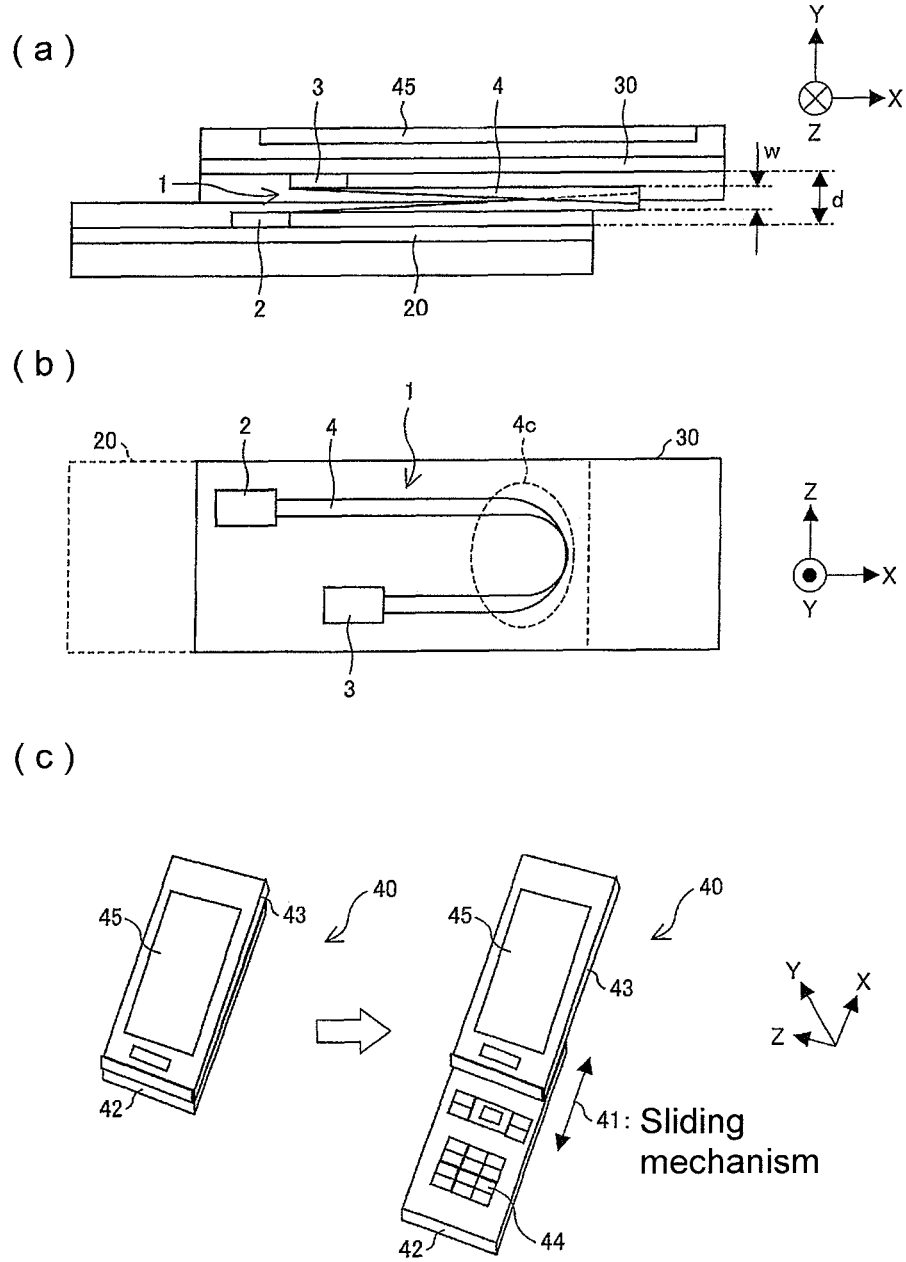
Figure 2:
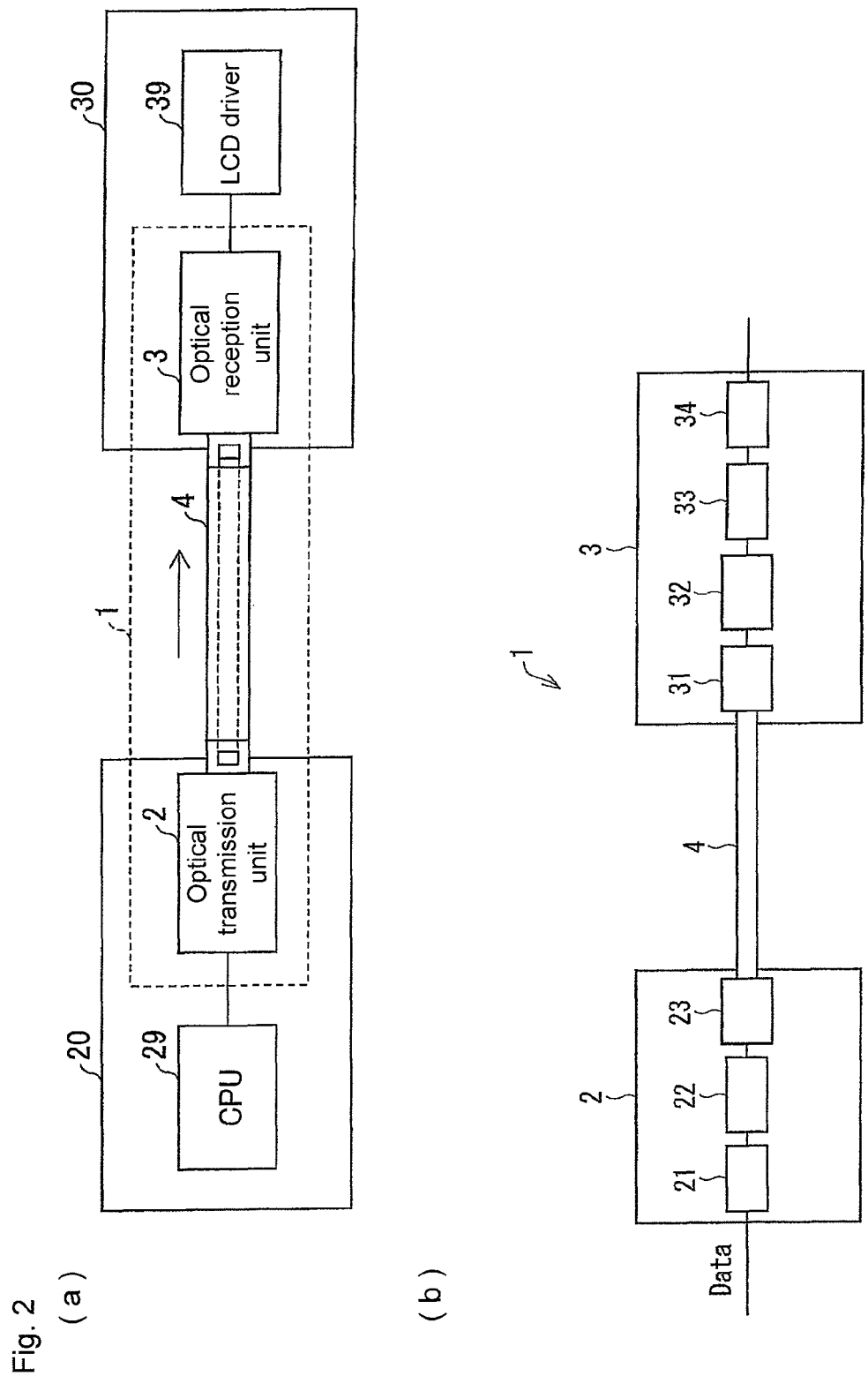
FIG. 2(a) is a block diagram illustrating a portion to which the optical transmission module is applied in the mobile telephone of FIGS. 1(a) to 1(c)
FIG. 2(b) is a block diagram illustrating a schematic configuration of the optical transmission module in the mobile telephone of FIGS. 1(a) to 1(c).

One or more embodiments of the present invention will be described below with reference to FIGS. 1(a) to 22(b). In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Specifically, in a configuration of a sliding type mobile telephone according to one or more embodiments of the present invention, information (data) transmission is performed between a main body portion and a cover portion through an optical transmission module by way of example. The sliding type mobile telephone includes the main body portion that includes a manipulation key, the cover portion that includes a display screen, and a sliding mechanism that moves the main body portion and the cover portion in parallel with each other.

FIG. 1(a) is a side sectional view illustrating a schematic configuration of a sliding type mobile telephone 40 in which an optical transmission module 1 according to one or more embodiments of the present invention is incorporated. FIG. 1(b) is top plan view illustrating the schematic configuration of the sliding type mobile telephone 40. FIG. 1(c) is a perspective view illustrating an appearance of the sliding type mobile telephone 40. In FIGS. 1(a) to 1(c), a direction in which sliding is performed by a sliding mechanism 41 is set to an X-direction, a direction normal to a transmission-side board (first circuit board) 20 and a reception-side board (second circuit board) 30, moved in parallel by the sliding mechanism 41, is set to a Y-direction, and a direction perpendicular to the X-direction and the Y-direction is set to a Z-direction.

As illustrated in FIG. 1(c), the sliding type mobile telephone 40 (hereinafter simply referred to as mobile telephone 40) according to one or more embodiments of the present invention includes a main body portion 42, a cover portion 43, and the sliding mechanism 41 that moves the main body portion and the cover portion in parallel with each other. In the mobile telephone 40, the main body portion 42 and the cover portion 43 are relatively moved in a direction of an arrow illustrated in FIG. 1(c) by the sliding mechanism 41.

The main body portion 42 includes a manipulation key 44 that manipulates the mobile telephone 40 and the transmission-side board 20 that is provided therein. A CPU 29 that performs integrated control of elements (not illustrated) mounted on the transmission-side board 20 is mounted on the transmission-side board 20.

The cover portion 43 is externally provided with a display screen 45 and a camera (not illustrated), and is internally provided with the reception-side board 30. An LCD (Liquid Crystal Display) (not illustrated) that displays an image based on image data transferred from the CPU 29, an LCD driver 39 that drives and controls the LCD, and a camera module (not illustrated) are mounted on the reception-side board 30. The camera module includes the camera that picks up an image of a subject and a camera driving unit that drives and controls the camera.

In the mobile telephone 40 having the above structure, the optical transmission module 1 connects the transmission-side board 20 and the reception-side board 30 to perform signal transmission between the boards 20 and 30.

(Basic Configuration of Optical Transmission Module)

A basic configuration of the optical transmission module 1 will be described with reference to FIGS. 2(a) and 2(b). FIG. 2(a) is a block diagram illustrating a portion to which the optical transmission module 1 is applied in the mobile telephone 40 according to one or more embodiments of the present invention. FIG. 2(b) is a block diagram illustrating a schematic configuration of the optical transmission module 1 in the mobile telephone 40 according to one or more embodiments of the present invention.

As illustrated in FIG. 2(a), the optical transmission module 1 includes an optical transmission unit 2, an optical reception unit 3, and an optical transmission path 4. The optical transmission unit 2 is connected to the transmission-side board 20 on which the CPU 29 is mounted. The optical reception unit 3 is connected to the reception-side board 30 on which the application circuits, such as the LCD driver 39, are mounted. The optical transmission path 4 constitutes the optical wiring that connects the optical transmission unit 2 and the optical reception unit 3.

The optical transmission path 4 is a medium through which the optical signal that is the data signal outputted from a light emitting unit 23 is transmitted to a light receiving unit 31. The details of the optical transmission path 4 are described later.

As illustrated in FIG. 2(b), the optical transmission unit 2 includes an interface circuit (hereinafter referred to as I/F circuit) 21, a light emission driving unit 22, and the light emitting unit 23.

The I/F circuit 21 receives a signal from the outside. The I/F circuit 21 is provided between the light emission driving unit 22 and electric wiring of an electric signal inputted to the optical transmission module 1 from the outside.

The light emission driving unit 22 drive the light emission of the light emitting unit 23 based on the electric signal inputted to the optical transmission module 1 from the outside through the I/F circuit 21. For example, the light emission driving unit 22 can be formed by a light emission driving IC (Integrated Circuit).

The light emitting unit 23 emits light based on the driving control performed by the light emission driving unit 22. The light emitting unit 23 can be formed by a light emitting element such as a VCSEL (Vertical Cavity-Surface Emitting Laser). An end portion on a light incident side of the optical transmission path 4 is irradiated with the light emitted from the light emitting unit 23 as the optical signal.

Thus, the optical transmission unit 2 converts the electric signal inputted to the optical transmission unit 2 into the optical signal corresponding to the electric signal and outputs the optical signal to the optical transmission path 4.

The optical reception unit 3 includes a light receiving unit 31, a detection circuit 32, an amplifying unit (amplifier) 33, and an I/F circuit 34.

The light receiving unit 31 receives the light that is the optical signal outputted from the end portion on the light incident side of the optical transmission path 4, and the light receiving unit 31 outputs the electric signal by photoelectric conversion. The light receiving unit 31 outputs a data signal. The light receiving unit 31 can be formed by a light receiving element such as a PD (Photo-diode). The detection circuit 32 determines whether the light receiving unit 31 receives the optical signal.

The amplifying unit 33 amplifies the electric signal, outputted from the light receiving unit 31 and the detection circuit 32, to a desired value and outputs the amplified electric signal to the outside. For example, the amplifying unit 33 can be formed by an amplifying IC.

The I/F circuit 34 outputs the electric signal amplified by the amplifying unit 33 to the outside of the optical transmission module 1. The I/F circuit 34 is connected to electric wiring through which the electric signal is transmitted to the outside, and the I/F circuit 34 is provided between the amplifying unit 33 and the electric wiring.

Thus, the optical reception unit 3 receives the optical signal outputted from the optical transmission unit 2 through the optical transmission path 4 and converts the optical signal into the electric signal corresponding to the optical signal, and the optical reception unit 3 can amplify the electric signal to the desired signal value to output the amplified electric signal to the outside.

In the optical transmission module 1, the I/F circuit 21 and light emission driving unit 22 of the optical transmission unit 2 and the detection circuit 32, amplifying unit 33, and I/F circuit 34 of the optical reception unit 3 may be integrated into one-chip IC.

(Configuration of Optical Transmission Path)

The details of the optical transmission path 4 will be described below with reference to FIGS. 3(a) and 3(b). FIG. 3(a) illustrates a side view of the optical transmission path 4. As illustrated in FIG. 3(a), the optical transmission path 4 includes a columnar core portion 4α having an axis in an optical transmission direction and a clad portion 4β that is provided so as to surround a circumference of the core portion 4α. The core portion 4α and the core portion 4β are made of materials having translucency, and a refractive index of the core portion 4α is higher than a refractive index of the clad portion 4β. Therefore, the optical signal incident to the core portion 4α is transmitted in the optical transmission direction by repeating total reflection in the core portion 4α.

Glass or plastic can be used as the materials for the core portion 4α and the clad portion 4β. Acrylic, epoxy, urethane, and silicone resin materials are used in order to form the optical transmission path 4 having the sufficient flexibility. The clad portion 4β may be formed by gas such as air. The similar effect can be obtained when the clad portion 4β is placed in an atmosphere of a liquid having a refractive index smaller than that of the core portion 4α.

A mechanism of the optical transmission through the optical transmission path 4 will be described below with reference to FIG. 3(b). FIG. 3(b) schematically illustrates a state of the optical transmission in the optical transmission path 4. As illustrated in FIG. 3(b), the optical transmission path 4 is formed by a columnar member having flexibility. A light incident surface 4A is provided in the end portion on the light incident side of the optical transmission path 4 while a light outgoing surface 4B is provided in the end portion on the light outgoing side.

The light emitted from the light emitting unit 23 is incident to the end portion on the light incident side of the optical transmission path 4 from a direction at a right angle or a substantially right angle to the optical transmission direction of the optical transmission path 4. The incident light is reflected from the light incident surface 4A and introduced into the optical transmission path 4, and the light travels in the core portion 4α. The light that travels in the optical transmission path 4 to reach the end portion on the light outgoing side is reflected from the light outgoing surface 4B and outputted in the direction at a right angle or a substantially right angle to the optical transmission direction of the optical transmission path 4. The light receiving unit 31 is irradiated with the output light, and the light receiving unit 31 performs the photoelectric conversion.

According to such a configuration, the light emitting unit 23 as the light source can be disposed in the direction at a right angle or a substantially right angle to the optical transmission direction of the optical transmission path 4. Therefore, for example, when the need to dispose the optical transmission path 4 in parallel with the board surface arises, the light emitting unit 23 may be provided between the optical transmission path 4 and the board surface so as to emit the light in the direction normal to the board surface. In the above configuration, compared with a configuration in which the light emitting unit 23 is provided so as to emit the light in parallel with the board surface, the mounting is easy to perform, and the compact configuration can be realized. This is because, in the general configuration of the light emitting unit 23, a size in the direction perpendicular to the direction in which the light is emitted is larger than a size in the direction in which the light is emitted. The above configuration can also be applied to a configuration in which a surface-mounting light emitting element, in which an electrode and the light emitting unit 23 are provided in the same plane, is used.

As described above, the optical transmission path 4 illustrated in FIGS. 3(a) and 3(b) has the configuration in which the light incident surface 4A and the light outgoing surface 4B are inclined. The optical transmission path 4 according to one or more embodiments of the present invention may have the configuration in which both end faces are orthogonal to the optical transmission direction. That is, an outer shape of the optical transmission path 4 may be formed into a rectangular shape.

In the configuration of the optical transmission path 4 illustrated in FIGS. 3(a) and 3(b), the sectional shape in the YZ plane is a square. However, the sectional shape of the optical transmission path 4 according to one or more embodiments of the present invention is not limited to such a point-symmetric shape. The sectional shape of the optical transmission path 4 may not have the point-symmetric shape such as the square, but may have a rectangular shape whose aspect ratio is not 1. The sectional shape of the optical transmission path 4 may be an ellipsoidal shape.

Herein, the optical waveguide including the core portion 4α and the clad portion 4β is cited as an example of the optical transmission path 4. Any well-known transmission path in which the light can be transmitted may be used as the optical transmission path 4. For example, a POF (Plastic Optical Fiber) may be used as the optical transmission path 4. When the POF (Plastic Optical Fiber) is used as the optical transmission path 4, the optical transmission path 4 is included in the optical transmission module 1 according to one or more embodiments of the present invention unless the optical transmission path 4 has a circular sectional shape.

(Characteristic Configuration of Optical Transmission Module)

Figure 4:
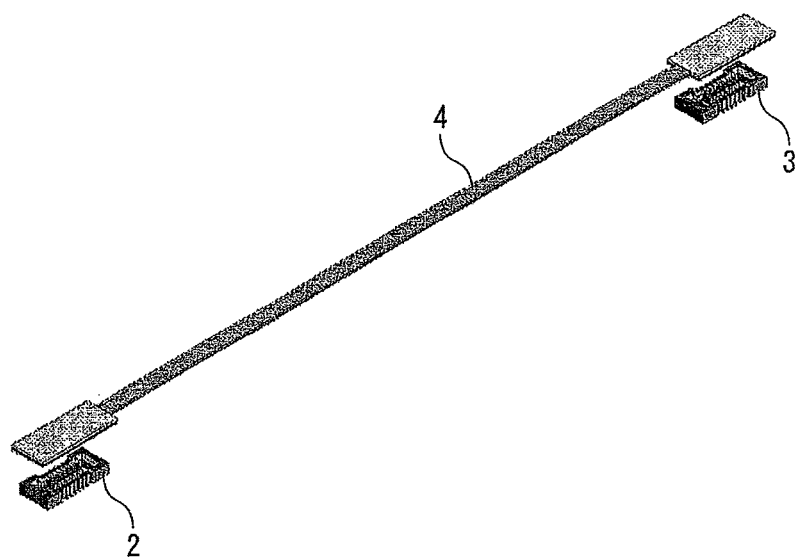
FIG. 4 is a perspective view illustrating a schematic configuration of the optical transmission module.
Figure 5:
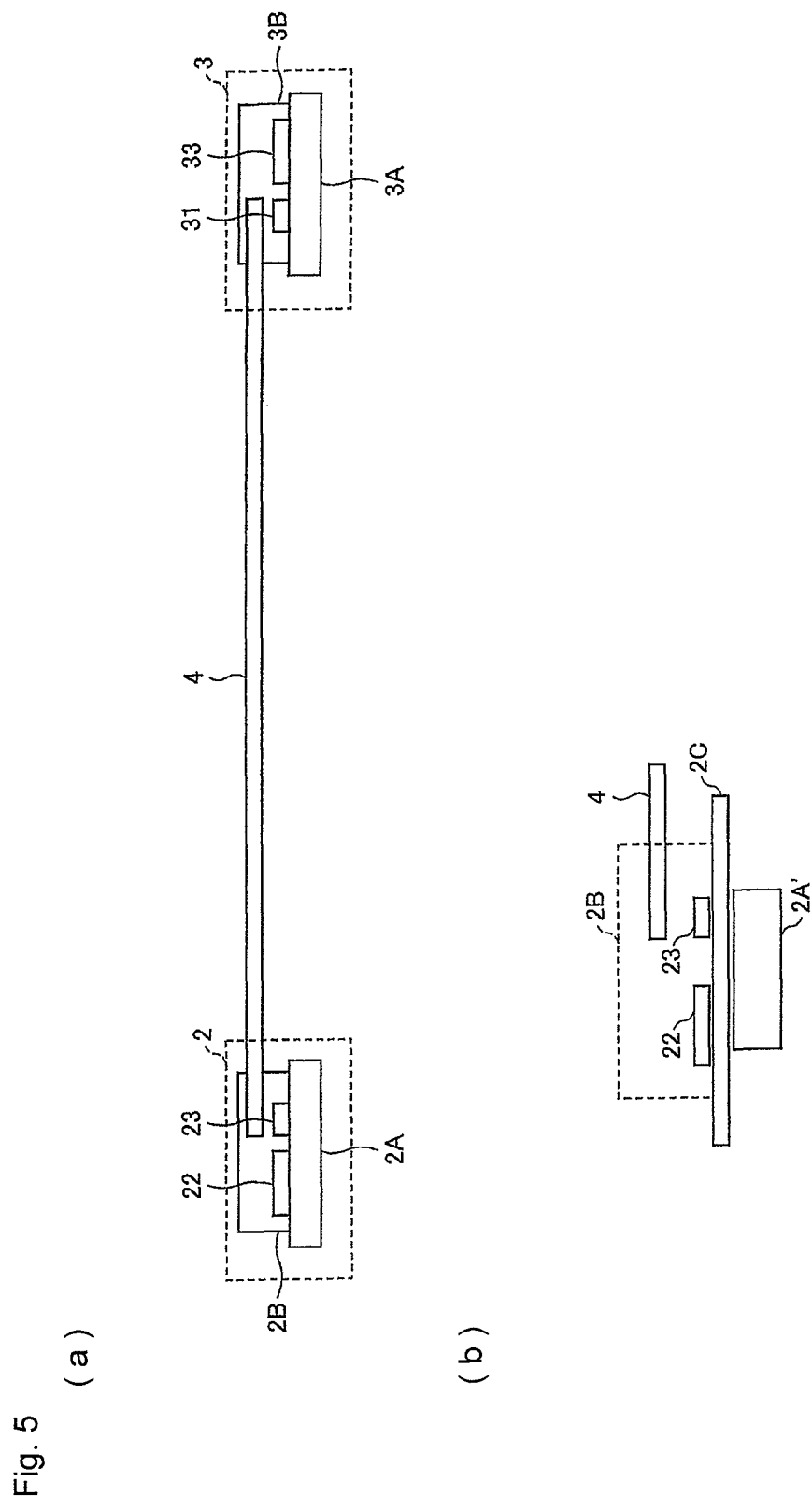

A characteristic configuration of the optical transmission module 1 will be described with reference to FIGS. 1(a) and 1(b) and FIGS. 4 to 6. FIG. 4 is a perspective view illustrating a schematic configuration of the optical transmission module 1. FIGS. 5(a) and 5(b) illustrate a specific configuration of the optical transmission module 1, and FIG. 5(a) is a sectional view of the optical transmission module 1.

As illustrated in FIG. 4, the optical transmission path 4 is connected as the flexible film optical wiring to the optical transmission unit 2 and the optical reception unit 3. The optical transmission path 4 is formed by the flexible wiring, which allows the optical transmission module 1 to be applied to compact electronic instruments such as a mobile device.

As illustrated in FIG. 5(a), the optical transmission unit 2 includes a transmission-side contact unit 2A and a transmission-side housing 2B. The transmission-side contact unit 2A has a structure in which the transmission-side contact unit 2A can be connected to the transmission-side board 20. The end portion on the light incident side of the optical transmission path 4 is accommodated in the transmission-side housing 2B, and the members, such as the light emission driving unit 22 and the light emitting unit 23, which constitute the optical transmission unit 2 are accommodated in the transmission-side housing 2B.

The optical reception unit 3 includes a reception-side contact unit 3A and a reception-side housing 3B. The reception-side contact unit 3A has a structure in which the reception-side contact unit 3A can be attached to the reception-side board 30. The end portion on the light outgoing side of the optical transmission path 4 is accommodated in the reception-side housing 3B, and the members, such as the light receiving unit 31 and the amplifying unit (amplifier) 33, which constitute the optical reception unit 3 are accommodated in the reception-side housing 3B.

There is no particular limitation to the transmission-side contact unit 2A and the reception-side contact unit 3A as long as the transmission-side contact unit 2A and the reception-side contact unit 3A can be attached to the transmission-side board 20 and the reception-side board 30. A connector connection structure can be cited as a typical example of the structures of the transmission-side contact unit 2A and the reception-side contact unit 3A. FIG. 5(b) is a sectional view illustrating a configuration of the optical transmission unit 2 when the transmission-side contact unit 2A has the connector connection structure. When the reception-side contact unit 3A has the connector connection structure, because a configuration of the optical reception unit 3 is similar to the configuration illustrated in FIG. 5(b), the description thereof will not be given.

As illustrated in FIG. 5(b), the light emission driving unit 22 and the light emitting unit 23 are mounted on a mounting board 2C. In the transmission-side housing 2B, the optical transmission path 4 is disposed at a position at which the end portion on the light incident side of the optical transmission path 4 is optically coupled to the light emitting unit 23. A transmission-side contact unit 2A' as the transmission-side contact unit 2A is provided in a surface opposite to the light emitting unit 23 and the light emission driving unit 22 in the mounting board 2C. A method for attaching the transmission-side contact unit 2A and the reception-side contact unit 3A and detailed structures of the transmission-side contact unit 2A and the reception-side contact unit 3A will be described later.

As illustrated in FIGS. 1(a) and 1(b), one of the features of the optical transmission module 1 according to one or more embodiments of the present invention is that the optical transmission path 4 is twisted about the optical transmission direction. The optical reception unit 3 can be attached and connected to the reception-side board 30 when the optical transmission path 4 is twisted. In the optical transmission method in which, using the optical transmission path 4, the optical transmission is performed between the transmission-side board 20 and the reception-side board 30, which are disposed opposite to each other, the optical transmission unit 2 and the optical reception unit 3 are disposed on the transmission-side board 20 and the reception-side board 30, respectively. The optical transmission path 4 is mounted on the optical transmission unit 2 and the optical reception unit 3 while the optical transmission path 4 is twisted, and the optical reception unit 3 receives the optical signal transmitted from the optical transmission unit 2.

Figure 6:
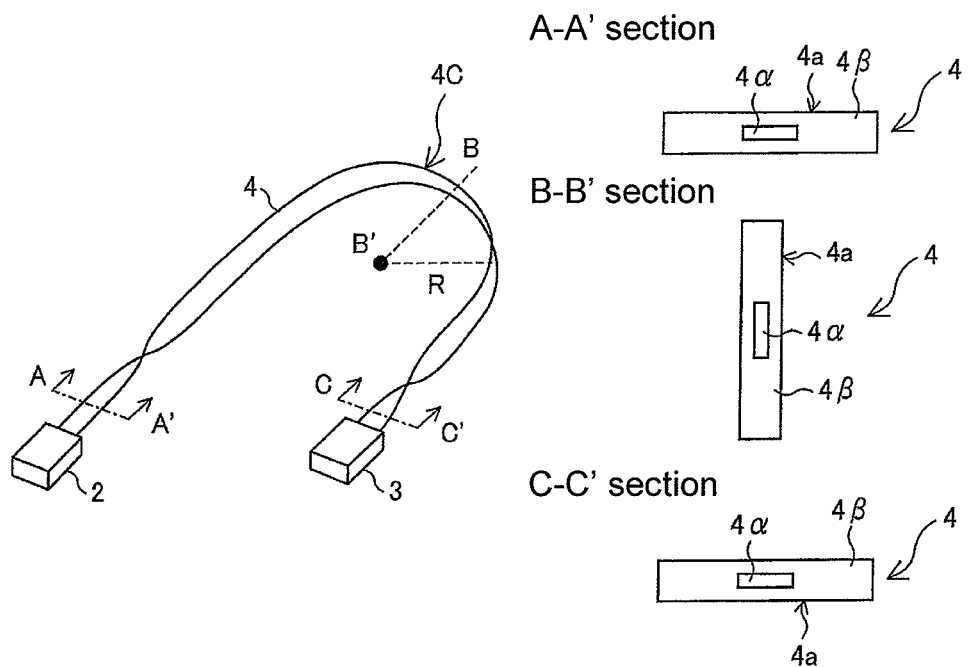
FIG. 6 is a perspective view illustrating the detailed configuration of the optical transmission module of FIGS. 1(a) and 1(b), a sectional view taken along line A-A', a sectional view taken along line B-B', and a sectional view taken along line C-C'.

FIG. 6 is a perspective view illustrating the detailed configuration of the optical transmission module 1 of FIGS. 1(a) and 1(b), a sectional view taken along line A-A', a sectional view taken along line B-B', and a sectional view taken along line C-C'. As illustrated in FIG. 6, in the optical transmission module 1, the optical transmission path 4 has a flat sectional shape in the A-A' section, the B-B' section, and the C-C' section (section vertical to the optical transmission direction). The optical transmission path 4 includes a bending portion 4C having a folded structure having a bending radius R, and the circumferential portion (bending portion 4C) drawn by the bending radius R is provided substantially vertical to the board surfaces of the transmission-side board 20 and the reception-side board 30. At this time, in the optical transmission path 4 near the end portion on the light incident side, as illustrated in the B-B' sectional view, a surface 4a in a direction normal to the board surface is disposed along the normal direction (direction vertical to the board surface) by twisting the optical transmission path 4 by 90° in a first direction in the bending portion 4C. The optical transmission path 4 near the end portion on the light outgoing side is folded back by further twisting the optical transmission path 4 by 90° in the first direction from the bending portion 4C, and the optical transmission path 4 near the end portion on the light outgoing side is reversed compared with the optical transmission path 4 near the end portion on the light incident side. That is, as illustrated in the A-A' sectional view and the C-C' sectional view, the surface 4a of the optical transmission path 4 near the end portion on the light incident side and the surface 4a of the optical transmission path 4 near the end portion on the light outgoing side are opposite to each other in the normal direction.

According to the configuration of the optical transmission module 1, the optical transmission path 4 is twisted by 180° about the optical transmission direction (longitudinal direction) to generate the twist in the bending portion 4C of the optical transmission path 4. The bending direction of the bending portion 4C changes by the twist. As a result, as illustrated in the top plan view of FIG. 1(b), the bending portion 4C of the optical transmission path 4 is bent in the direction (Z-direction) along the board surfaces of the transmission-side board 20 and the reception-side board 30, so that the bending radius of the bending portion 4C can be set to any radius irrespective of the distance (hereinafter simply referred to as board-to-board distance d) between the transmission-side board 20 and the reception-side board 30. Accordingly, in the optical transmission module 1, even if the board-to-board distance d is lower than the bending resistance limit of the optical transmission path 4 (bending resistance cannot be maintained), the optical transmission path 4 can be accommodated within the distance to realize the narrow accommodation space, and therefore the low profile of the mobile telephone 40 can be achieved.

Figure 7:
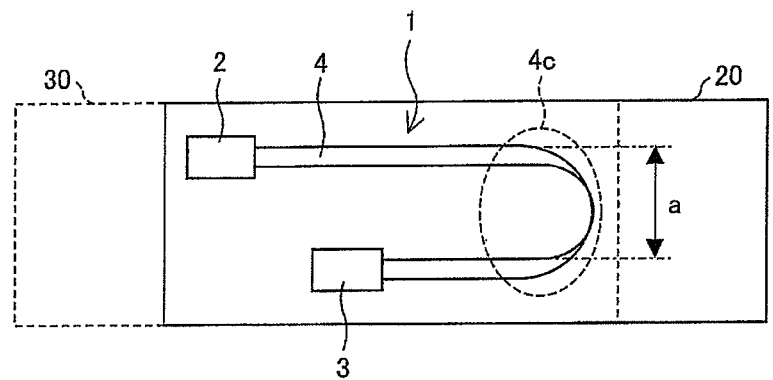
FIG. 7 is a top plan view for describing an effect of the optical transmission module of FIGS. 1(a) to 1(c).
Figure 23:
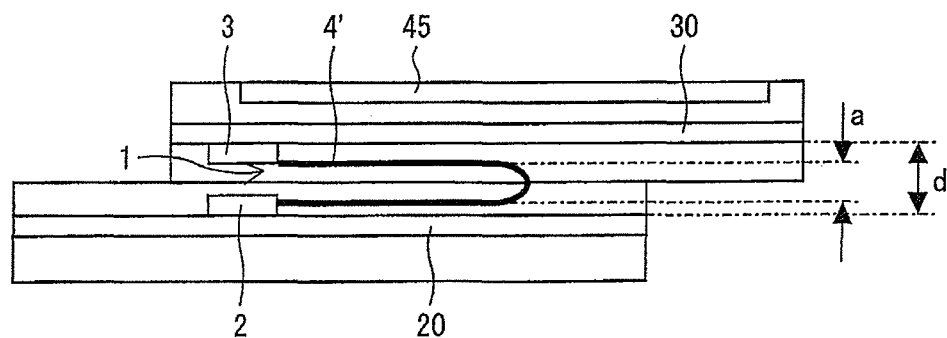
FIG. 23 is a side view illustrating a configuration in which techniques described in Patent Documents 1 and 2 are applied to an optical transmission module.

Hereinafter, an effect of the optical transmission module 1 will be described in detail with reference to FIG. 7 when compared with the conventional configuration illustrated in FIG. 23. FIG. 7 is a top plan view for describing the effect of the optical transmission module 1.

The setting of the bending radius of the optical transmission path 4' in the configuration illustrated in FIG. 23 will first be described. The optical transmission path 4' illustrated in FIG. 23 is bent into the U-shape from the transmission-side board 20 toward the reception-side board 30. Therefore, the bending radius of the optical transmission path 4' is set such that bending radius×2 (hereinafter referred to as bending diameter a) is lower than the board-to-board distance d. That is, in the configuration illustrated in FIG. 23, the board-to-board distance d cannot be set so as to become lower than the bending diameter a of the optical transmission path 4'. Therefore, even if the bending radius of the optical transmission path 4' is set to the limit bending radius of the lower limit at which the bending resistance is maintained in order to realize the low profile, the board-to-board distance d cannot be set lower than limit bending radius×2 (hereinafter referred to as bending diameter). Accordingly, in the configuration illustrated in FIG. 23, the bending limit radius of the optical transmission path 4' restricts the low profile of the mobile telephone (the low profile of the sliding mechanism 41).

On the other hand, in the optical transmission module 1, while the optical transmission path 4 is twisted by 180° about the optical transmission direction, the transmission-side contact unit 2A and the reception-side contact unit 3A are connected to the transmission-side board 20 and the reception-side board 30. The twist of the optical transmission path 4 does not bend the bending portion 4C into the U-shape from the transmission-side board 20 toward the reception-side board 30, but the bending portion 4C is twisted and bent along the board surfaces of the transmission-side board 20 and the reception-side board 30. Therefore, as illustrated in FIG. 7, the bending diameter a (bending radius×2) of the bending portion 4C can arbitrarily be set in the direction parallel to the board surfaces irrespective of the board-to-board distance d. Accordingly, in the optical transmission module 1, the board-to-board distance d can be set lower than the bending limit diameter of the optical transmission path 4. Therefore, compared with the configuration illustrated in FIG. 22, the accommodation space for the optical transmission path 4 can be narrowed to realize the low profile of the mobile telephone (the low profile of the sliding mechanism 41).

In one or more embodiments of the present invention, the twisting angle of the optical transmission path 4 is set to 180°. However the twisting angle may be set to any angle at which the bending portion 4C is twisted and bent along the board surfaces of the transmission-side board 20 and the reception-side board 30 (that is, the width direction of the bending portion 4C becomes substantially vertical to the board surface or more). When the twisting angle of the optical transmission path 4 is set to 90° or more, the above effect can be realized.

(Positions at which Optical Transmission Unit 2 and Optical Reception Unit 3 are Mounted on Transmission-Side Board 20 and Reception-Side Board 30)

In FIG. 1(b) and FIG. 7, the optical transmission unit 2 and the optical reception unit 3 are disposed such that the interval between the optical transmission unit 2 and the optical reception unit 3 becomes the bending diameter a in the Z-direction. However, the dispositions of the optical transmission unit 2 and the optical reception unit 3 are not limited to the dispositions in FIG. 1(b) and FIG. 7.

When viewed from the Y-direction, the optical transmission unit 2 and the optical reception unit 3 may be disposed so as not to be overlapped with each other when the transmission-side board 20 and the reception-side board 30 of the mobile telephone 40 are in the state of any one of a closed position, an opened position, and an intermediate position between the closed position and the opened position. The positions at which the optical transmission unit 2 and the optical reception unit 3 are mounted on the mobile telephone 40 will be described in detail with reference to FIGS. 8(a) to 8(d) and FIGS. 9(a) to 9(d). FIGS. 8(a) to 8(d) illustrate an example of the positions at which the optical transmission unit 2 and the optical reception unit 3 are mounted in the mobile telephone 40, wherein FIG. 8(a) is a perspective view for describing the opened position and the closed position in the mobile telephone 40, FIG. 8(b) is a top plan view illustrating the positions at which the optical transmission unit 2 and the optical reception unit 3 are mounted when the optical transmission unit 2 and the optical reception unit 3 are in the closed position, FIG. 8(c) is a side view illustrating the positions at which the optical transmission unit 2 and the optical reception unit 3 are mounted when the optical transmission unit 2 and the optical reception unit 3 are in the closed position, and FIG. 8(d) is a top plan view illustrating the positions at which the optical transmission unit 2 and the optical reception unit 3 are mounted when the optical transmission unit 2 and the optical reception unit 3 are in the opened position.

As used herein, the closed position means a relative position of the transmission-side board 20 and the reception-side board 30 when the main body portion 42 and the cover portion 43 of the mobile telephone 40 are in the state illustrated on the left of FIG. 8(a). In the state of the closed position, as illustrated in FIGS. 8(b) and 8(c), an end portion 20a of the transmission-side board 20 is disposed while overlapped with an end portion 30a of the reception-side board 30 in the sliding direction (X-direction). An end portion 20b of the transmission-side board 20 is disposed while overlapped with an end portion 30b of the reception-side board 30. That is, in the state of the closed position, the end portions (the end portions 20a and 20b and the end portions 30a and 30b) of the transmission-side board 20 and the reception-side board 30 are disposed while overlapped with each other in the sliding direction (X-direction).

The opened position means a relative position of the transmission-side board 20 and the reception-side board 30 when the main body portion 42 and the cover portion 43 of the mobile telephone 40 are in the state illustrated on the right of FIG. 8(a). In the state of the opened position, as illustrated in FIG. 8(d), the end portion 20a of the transmission-side board 20 is disposed so as to come closest to the end portion 30b of the reception-side board 30 in the sliding direction (X-direction).

The intermediate position means a relative position of the transmission-side board 20 and the reception-side board 30 from the closed position to the opened position.

As illustrated in FIGS. 8(b) to 8(d), when viewed from the Y-direction, the optical transmission unit 2 and the optical reception unit 3 are disposed so as not to be overlapped with each other at any one of the closed position, the opened position, and the intermediate position. Therefore, the board-to-board distance d can be set lower than the sum of thicknesses of the optical transmission unit 2 and the optical reception unit 3 in the Y-direction, and the low profile of the sliding mechanism 41 can be realized.

In the case where the optical transmission unit 2 and the optical reception unit 3 are disposed so as to be overlapped with each other at any of the closed position, the opened position, and the intermediate position when viewed from the Y-direction, possibly the optical transmission unit 2 and the optical reception unit 3 abut on each other when the sliding mechanism 41 moves the transmission-side board 20 and the reception-side board 30 in parallel. Therefore, because the board-to-board distance d cannot be set lower than the sum of the thicknesses of the optical transmission unit 2 and the optical reception unit 3 in the Y-direction, the low profile of the sliding mechanism 41 is restricted.

In the example illustrated in FIGS. 8(b) to 8(d), the distance between the optical transmission unit 2 and the optical reception unit 3 is equal to or lower than the bending diameter (bending radius×2) of the optical transmission path 4, so that an occupied area of the optical transmission module 1 can be reduced in the mobile telephone 40. That is, the optical transmission unit 2 may be identical to the optical reception unit 3 in the position in the Z-direction.

FIGS. 9(a) to 9(d) illustrate another example of the positions at which the optical transmission unit 2 and the optical reception unit 3 are mounted in the mobile telephone 40, wherein FIG. 9(a) is a perspective view for describing the opened position and the closed position in the mobile telephone 40, FIG. 9(b) is a top plan view illustrating the positions at which the optical transmission unit 2 and the optical reception unit 3 are mounted when the optical transmission unit 2 and the optical reception unit 3 are in the closed position, FIG. 9(*c*) is a side view illustrating the positions at which the optical transmission unit 2 and the optical reception unit 3 are mounted when the optical transmission unit 2 and the optical reception unit 3 are in the closed position, and FIG. 9(*d*) is a top plan view illustrating the positions at which the optical transmission unit 2 and the optical reception unit 3 are mounted when the optical transmission unit 2 and the optical reception unit 3 are in the opened position.

In the example illustrated in FIGS. 9(*b*) to 9(*d*), when the transmission-side board 20 and the reception-side board 30 are in the closed position, the optical transmission unit 2 and the optical reception unit 3 are arrayed in the Z-direction. Even with such a configuration, the board-to-board distance d can be set lower than the sum of the thicknesses of the optical transmission unit 2 and the optical reception unit 3 in the Y-direction, and the low profile of the sliding mechanism 41 can be realized.

In the examples illustrated in FIGS. 8(*b*) to 8(*d*) and FIGS. 9(*b*) to 9(*d*), the low profile of the sliding mechanism 41 can advantageously be realized particularly when the sum of the thicknesses of the optical transmission unit 2 and the optical reception unit 3 in the Y-direction is more than the width of the optical transmission path 2. In such cases, the setting restriction of the board-to-board distance d due to the thicknesses of the optical transmission unit 2 and the optical reception unit 3 in the Y-direction can be avoided, and the board-to-board distance d can be shortened to the width of the optical transmission path 4.

(Connection Positions of Optical Transmission Unit 2 and Optical Reception Unit 3 in Optical Transmission Module 1)

There is no particular limitation to the optical transmission module 1 as long as the transmission-side contact unit 2A and the reception-side contact unit 3A are connected to the transmission-side board 20 and the reception-side board 30, respectively, when the optical transmission path 4 is twisted by 180°.

Even in the configuration illustrated in FIGS. 3(*a*) and 3(*b*) in which the light incident surface 4A and the light outgoing surface 4B are formed so as to become symmetrical while the light emitting unit 23 is disposed on the side of the light receiving unit 31 in the optical transmission path 4, the optical transmission module 1 can be mounted on the transmission-side board 20 and the reception-side board 30 while the optical transmission path 4 is twisted by 180°. In this configuration, when the optical transmission path 4 is twisted by 180°, connector forms of both the transmission-side contact unit 2A and the reception-side contact unit 3A are set such that the transmission-side contact unit 2A and the reception-side contact unit 3A are connected to the transmission-side board 20 and the reception-side board 30.

FIG. 10 is a side view illustrating an example of the configuration of the optical transmission module 1 provided with the optical transmission path 4 of FIGS. 3(*a*) and 3(*b*). As illustrated in FIG. 10, when the optical transmission module 1 includes the optical transmission path 4 of FIGS. 3(*a*) and 3(*b*), the optical transmission unit 2 and the optical reception unit 3 are disposed opposite to each other with the reception-side board 30 interposed therebetween. That is, the transmission-side board 20, the optical transmission unit 2, the reception-side board 30, and the optical reception unit 3 are disposed in this order in the Y-direction.

In addition to the configuration illustrated in FIG. 10, the optical transmission path 4 can be disposed while twisted by 180° even in the configuration in which the optical transmission unit 2, the transmission-side board 20, the reception-side board 30, and the optical reception unit 3 are disposed in this order in the Y-direction. In the above configuration, the optical transmission path 4 is disposed outside while avoiding the transmission-side board 20 and the reception-side board 30, or openings are formed in the transmission-side board 20 and the reception-side board 30 to pass the optical transmission path 4 through the opening, whereby the optical transmission path 4 can be disposed while twisted by 180°.

Connection positions of the optical transmission unit 2 and the optical reception unit 3 in the optical transmission module 1 will be described below with reference to FIGS. 11(*a*) to 11(*c*). FIGS. 11(*a*) to 11(*c*) illustrate a configuration of the optical transmission module 1, wherein FIG. 11(*a*) is a side view, FIG. 11(*b*) is a side view for describing the optical transmission module 1 when the optical transmission module 1 is mounted on the transmission-side board 20 and the reception-side board 30, and FIG. 11(*c*) is a schematic diagram illustrating a positional relationship among the optical transmission path 4, the light emitting unit 23, and the light receiving unit 31 in the optical transmission module 1.

As illustrated in FIG. 11(*a*), in the optical transmission module 1, the optical reception unit 3 is provided in a surface opposite to a surface in which the optical transmission unit 2 is provided in the optical transmission path 4. That is, the optical transmission unit 2 and the optical reception unit 3 are provided in the front surface and the rear surface of the optical transmission path 4, respectively.

In the optical transmission module 1 illustrated in FIG. 11(*a*), when the optical transmission module 1 is mounted on the transmission-side board 20 and the reception-side board 30, the optical transmission path 4 is twisted by 180° about the optical transmission direction, thereby obtaining the configuration illustrated in FIG. 11(*b*). In mounting the optical transmission module 1, the twist is naturally generated in the optical transmission path 4 by providing the optical transmission unit 2 and the optical reception unit 3 in the front surface and the rear surface of the optical transmission path 4. Therefore, the low profile of the mobile telephone 40 can easily be realized.

As illustrated in FIG. 11(*c*), in the optical transmission module 1 of FIG. 11(*a*), the light incident surface 4A and the light outgoing surface 4B of the optical transmission path 4 are formed so as to become parallel to each other. Therefore, the light emitted from the light emitting unit 23 is reflected from the light incident surface 4A and introduced into the optical transmission path 4, and the light travels in the core portion 4α. The light that travels in the optical transmission path 4 to reach the end portion on the light outgoing side is reflected from the light outgoing surface 4B and outputted in the opposite direction to the light emitting unit 23 in the optical transmission path 4.

(Dimensions of Optical Transmission Path 4)

Figure 12:
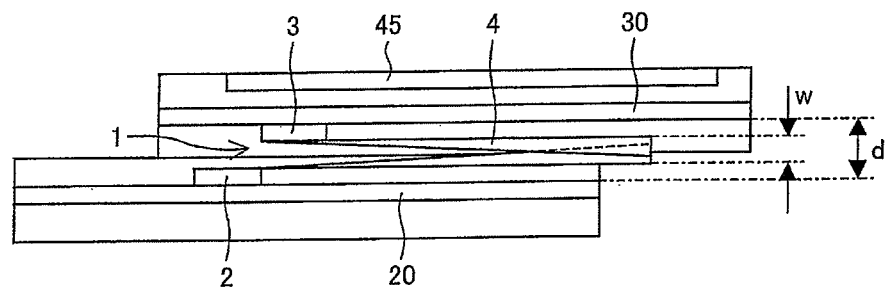
FIG. 12 is a side view for describing dimensions of the optical transmission path.

Next, dimensions of the optical transmission path 4 in the optical transmission module 1 will be described with reference to FIG. 12. FIG. 12 is a side view for describing dimensions of the optical transmission path 4.

In the optical transmission module 1, the twist of the optical transmission path 4 does not bend the bending portion 4C into the U-shape from the transmission-side board 20 toward the reception-side board 30, but the bending portion 4C is twisted and bent along the board surfaces of the transmission-side board 20 and the reception-side board 30. As a result, the bending portion 4C of the optical transmission path 4 is disposed such that the bending surface becomes substantially vertical to the board surface, and thus the board-to-board distance d is determined by a width W in the direction vertical to the optical transmission direction in the optical transmission path 4. Accordingly, in order to achieve the low profile of the mobile telephone 40, at least the width W of the bending portion 4C in the optical transmission path 4 becomes lower than the board-to-board distance d.

In the optical transmission module 1, portions except the bending portion 4C in the optical transmission path 4 are not disposed vertically to the board surface. Therefore, the widths W of the portions except the bending portion 4C in the optical transmission path 4 can be arbitrarily set irrespective of the board-to-board distance d. Therefore, in addition to the configuration in which the width W of the total length including the bending portion 4C is lower than the board-to-board distance d, the optical transmission path 4 may have a configuration in which only the bending portion 4C is lower than the board-to-board distance d while portions except the bending portion 4C are more than the board-to-board distance d.

Modification 1

Figure 13:
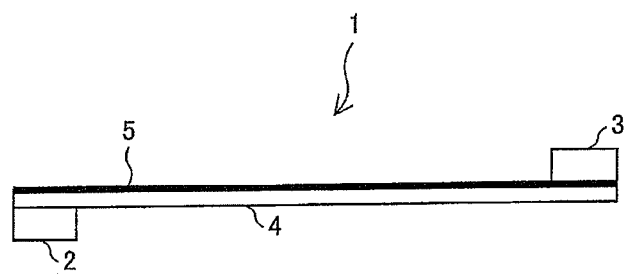
FIG. 13 is a side view illustrating a configuration of an optical transmission module according to Modification 1.

A modification of the configuration of the optical transmission module 1 according to one or more embodiments of the present invention illustrated in FIGS. 1(a) and 1(b) will be described below. FIG. 13 is a side view illustrating a configuration of an optical transmission module 1 according to Modification 1.

As illustrated in FIG. 13, in the optical transmission module 1 of Modification 1, a protective film 5 that protects the optical transmission path 4 is provided in one of a plurality of surfaces parallel to the optical transmission direction in the optical transmission path 4, as a member different from the member constituting the optical transmission path 4. The protective film 5 is a board film made of a material different from that of the member (optical transmission path 4) in which the optical signal is transmitted, and the fracture caused by the tension and wear-out of the optical transmission path 4 can be prevented by the protective film 5. In the plurality of surfaces parallel to the optical transmission direction in the optical transmission path 4, a coating may be provided in order to prevent the wear-out in the surface in which the protective film 5 is not provided. The coating may be provided instead of the protective film 5. Examples of the material used for the protective film 5 include PI (polyimide), PET (polyethylene terephthalate), and PP (polypropylene). With such a configuration, the optical transmission module 1 in which the durability of the tension and wear-out of the optical transmission path 4 is improved during the repeated bending can be realized.

Figure 14:
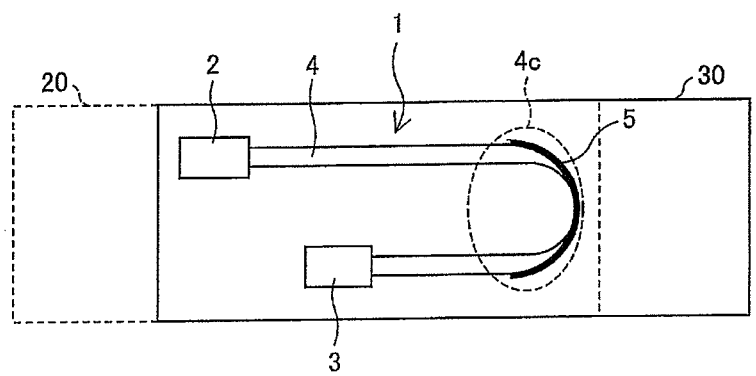
FIG. 14 is a top plan view illustrating an example of a disposition of a protective film in the optical transmission module of Modification 1.
Figure 15:
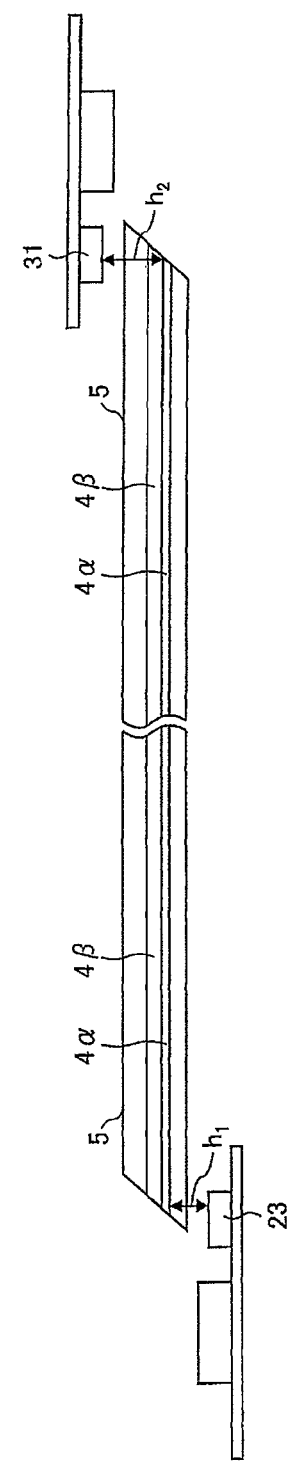
FIG. 15 is a sectional view illustrating another example of the disposition of the protective film in the optical transmission module of Modification 1.
Figure 16:
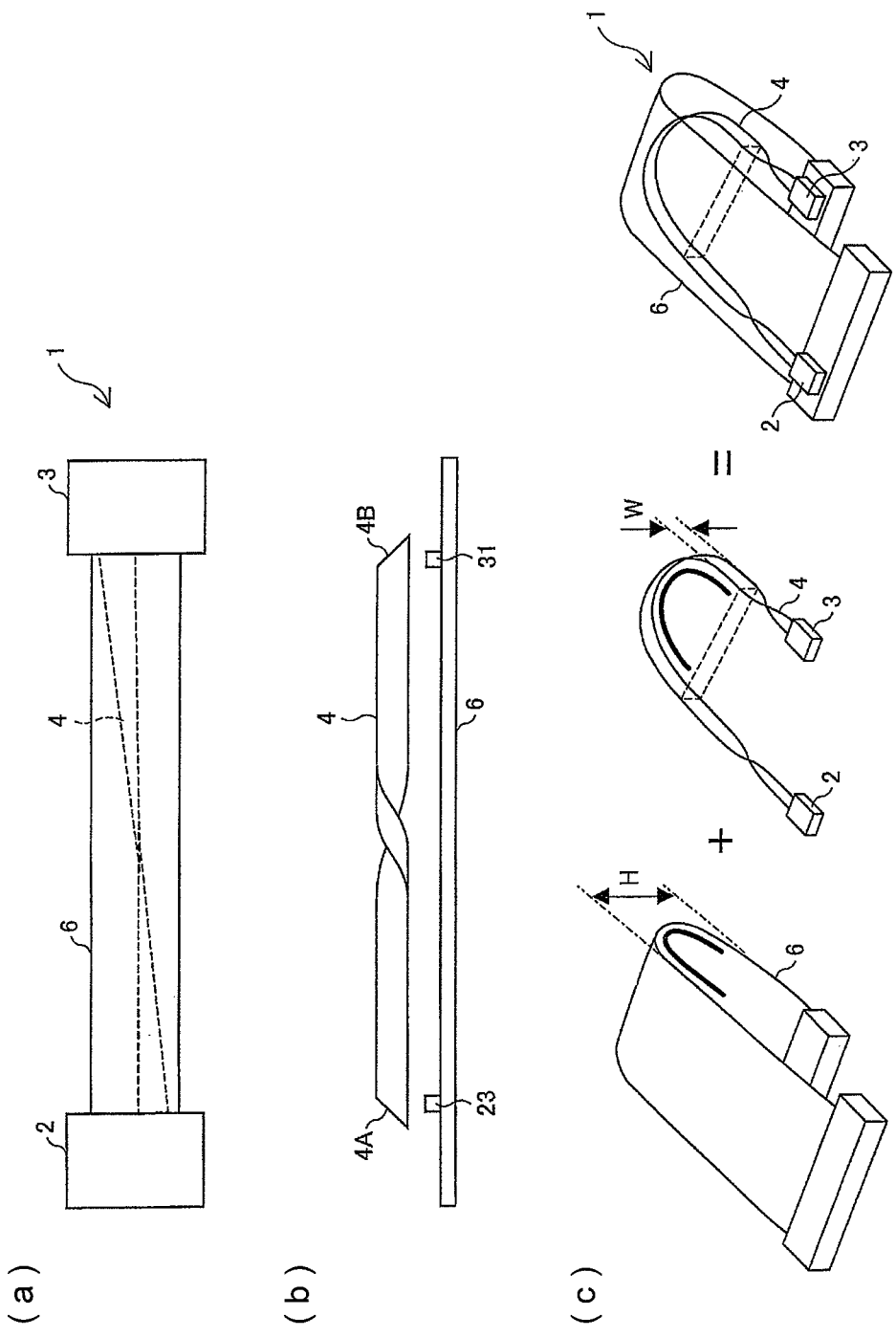

Next, the disposition of the protective film 5 in the optical transmission module 1 of Modification 1 will be described with reference to FIGS. 14 and 15. FIG. 14 is a top plan view illustrating an example of the disposition of the protective film 5 in the optical transmission module 1 of Modification 1. FIG. 15 is a sectional view illustrating another example of the disposition of the protective film 5 in the optical transmission module 1 of Modification 1.

As illustrated in FIG. 14, in the optical transmission module 1 of Modification 1, the protective film 5 may be provided in a surface that becomes the outside during the bending in the optical transmission path 4 (that is, the surface opposite to the optical transmission unit 2 and the optical reception unit 3 in the bending portion 4C). The protective film 5 has a characteristic in which the board film 5 is easily fractured by the repeated bending while the fracture caused by the tension of the optical transmission path 4 can be prevented. The bending resistance of the optical transmission path 4 can be improved by providing the easy-to-fracture protective film 5 in the surface that becomes the outside during the bending in the optical transmission path 4.

The optical transmission module 1 of Modification 1 may have a configuration illustrated in FIG. 15. In the configuration illustrated in FIG. 15, the light emitting unit 23 is disposed on the side on which the protective film 5 is provided in the optical transmission path 4. On the other hand, the light receiving unit 23 is disposed on the side on which the protective film 5 is not provided in the optical transmission path 4.

According to the configuration illustrated in FIG. 15, the protective film 5 is not interposed between the light emitting unit 23 and the optical transmission path 4, so that an optical coupling distance $h_1$ between the light emitting unit 23 and the optical transmission path 4 can be reduced. Therefore, an optical coupling loss between the light emitting unit 23 and the optical transmission path 4 can be reduced.

On the other hand, the protective film 5 is interposed between the light receiving unit 31 and the optical transmission path 4, so that an optical coupling distance $h_2$ between the light receiving unit 31 and the optical transmission path 4 is increased. In this case, because a diameter of the light receiving unit 31 can be reduced to about 100 μm, the optical coupling loss between the light receiving unit 31 and the optical transmission path 4 can be suppressed to a small level even if the optical coupling distance $h_2$ is increased.

In the configuration illustrated in FIG. 15, the protective film 5 is not interposed between the light emitting unit 23 and the optical transmission path 4, in which the optical coupling loss changes greatly according to the optical coupling distance $h_1$, but the protective film 5 is interposed between light receiving unit 31 and the optical transmission path 4, in which the small change of the optical coupling loss is generated according to the optical coupling distance $h_2$, so that the optical loss can be reduced in the whole optical transmission module 1. Accordingly, output of the light emitted from the light emitting unit 23 can be reduced and a current inputted to the light emitting unit 23 can also be reduced. Therefore, in the configuration illustrated in FIG. 15, power consumption of the optical transmission module 1 can be reduced.

Modification 2

Another modification of the configuration of the optical transmission module 1 according to one or more embodiments of the present invention illustrated in FIGS. 1(a) and 1(b) will be described below. FIGS. 16(a) to 16(c) illustrate a configuration of an optical transmission module 1 according to Modification 2, wherein FIG. 16(a) is a top plan view, FIG. 16(b) is a side view, and FIG. 16(c) is an exploded perspective view. The optical transmission module 1 of Modification 2 is mounted while integrated with electric wiring (electric transmission path) 6.

As illustrated in FIGS. 16(a) to 16(c), the optical transmission module 1 of Modification 2 includes the electric wiring 6 in which the electric signal is transmitted between the transmission-side board 20 and the reception-side board 30. The optical transmission unit 2 and the optical reception unit 3 are mounted on the same surface in the electric wiring 6. The optical transmission path 4 is mounted on the optical transmission unit 2 and the optical reception unit 3 while twisted by 180° about the optical transmission direction.

Occasionally, the electric wiring 6 is provided in the mobile telephone 40 for the purpose of supply of electric power. In such cases, in the signals transmitted in the transmission-side board 20 and the reception-side board 30, the data signal can be transmitted by the optical transmission path 4. Therefore, in the mobile telephone 40 including the optical transmission module 1 of Modification 2, it is not necessary to establish impedance matching between the optical transmission unit 2 and the optical reception unit 3. Additionally, it is not necessary to provide a robust EMI countermeasure. Therefore, a thin flexible printed circuit board (FPC) dedicated to the bending can be cited as the electric wiring 6. The low profile of the mobile telephone 4 can significantly be realized when the flexible printed circuit board (FPC) is used as the electric wiring 6.

On the other hand, in the optical transmission module 1 of Modification 2, the board-to-board distance d is determined by a bending radius H of the electric wiring 6. In the optical transmission module 1, the optical transmission path 4 is mounted on the surface that becomes the inside during the bending of the electric wiring 6. When the optical transmission path 4 is mounted on the surface that becomes the outside during the bending of the electric wiring 6, the board-to-board distance d is undesirably increased by the thickness of the optical transmission path 4.

In the optical transmission module 1 of Modification 2, the optical transmission path 4 is twisted by 180° about the optical transmission direction. Therefore, the following effect can be obtained compared with the case where the optical transmission path 4 is bent into the U-shape.

When the optical transmission path 4 is bent into the U-shape in the optical transmission module integrated with the electric wiring 6, the bending radius H of the electric wiring 6 can be reduced to a radius that substantially coincides with the bending limit radius of the optical transmission path 4. However, at this time, because most of an area of the optical transmission path 4 is in contact with the electric wiring 6, a mechanical load caused by friction with the electric wiring 6 is generated in the optical transmission path 4 in addition to a stress caused by the bending. In the optical transmission path 4 in which the stress is generated near the bending portion bent with the bending limit radius, when a breakage is generated by the friction with the electric wiring 6, the fracture is possibly generated from the breakage.

On the other hand, when the optical transmission path 4 is twisted by 180° about the optical transmission direction like the optical transmission module 1 of Modification 2, the contact area between the optical transmission path 4 and the electric wiring 6 becomes smaller than that of the case where the optical transmission path 4 is bent into the U-shape. Therefore, the mechanical load caused by the friction with the electric wiring 6 can be reduced, and the breakage caused by the friction with the electric wiring 6 can also be reduced. The bending radius of the optical transmission path 4 is arbitrarily set, so that the stress caused by the bending can be released.

Next, a method for assembling the optical transmission module 1 of Modification 2 will be described below. In this assembling method, first the optical transmission unit 2 and the optical reception unit 3 are arrayed in the optical transmission direction (a longitudinal direction of the electric wiring 6). Then the optical transmission path 4 is mounted on the optical transmission unit 2 and the optical reception unit 3 while twisted by 180° about the optical transmission direction. At this time, as illustrated in FIG. 16(b), the positions of the light incident surface 4A and the light outgoing surface 4B are adjusted such that the light emitting unit 23 and the optical transmission path 4 are optically coupled to each other while the light receiving unit 31 and the optical transmission path 4 are optically coupled to each other.

Therefore, the optical transmission module 1 can be assembled to reduce the production cost using the same equipment for the usual optical transmission module in which the optical transmission unit 2 and the optical reception unit 3 are disposed in the same surface as the optical transmission path 4.

In the optical transmission module 1 of Modification 2, the optical transmission unit 2 and the optical reception unit 3 may be mounted on the same surface in the electric wiring 6. The transmission-side contact unit 2A and the reception-side contact unit 3A may be connected to the transmission-side board 20 and the reception-side board 30, or the transmission-side contact unit 2A and the reception-side contact unit 3A may be connected to contact units of the transmission-side board 20 and the reception-side board 30 in the electric wiring 6. The transmission-side contact unit 2A and the reception-side contact unit 3A may be used as the contact units of the transmission-side board 20 and the reception-side board 30 in the electric wiring 6.

Modification 3

Figure 17:
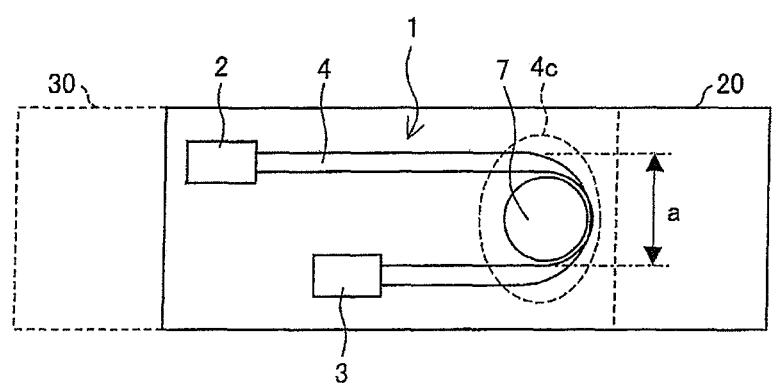
FIG. 17 is a top plan view illustrating a configuration of an optical transmission module 1 according to Modification 3.

Still another modification of the configuration of the optical transmission module 1 according to one or more embodiments of the present invention illustrated in FIGS. 1(a) and 1(b) will be described below. FIG. 17 is a top plan view illustrating a configuration of an optical transmission module 1 according to Modification 3.

As illustrated in FIG. 17, the optical transmission module 1 of Modification 3 includes a guide unit 7 that guides the bending of the optical transmission path 4. The guide unit 7 is provided in one of the board surfaces of the transmission-side board 20 and the reception-side board 30. The guide unit 7 is disposed so as to extend in the direction vertical to the board surface. Therefore, the bending portion 4C of the optical transmission path 4 can be provided at the fixed position, and the bending of the optical transmission path 4 can stably be maintained.

Modification 4

Figure 18:
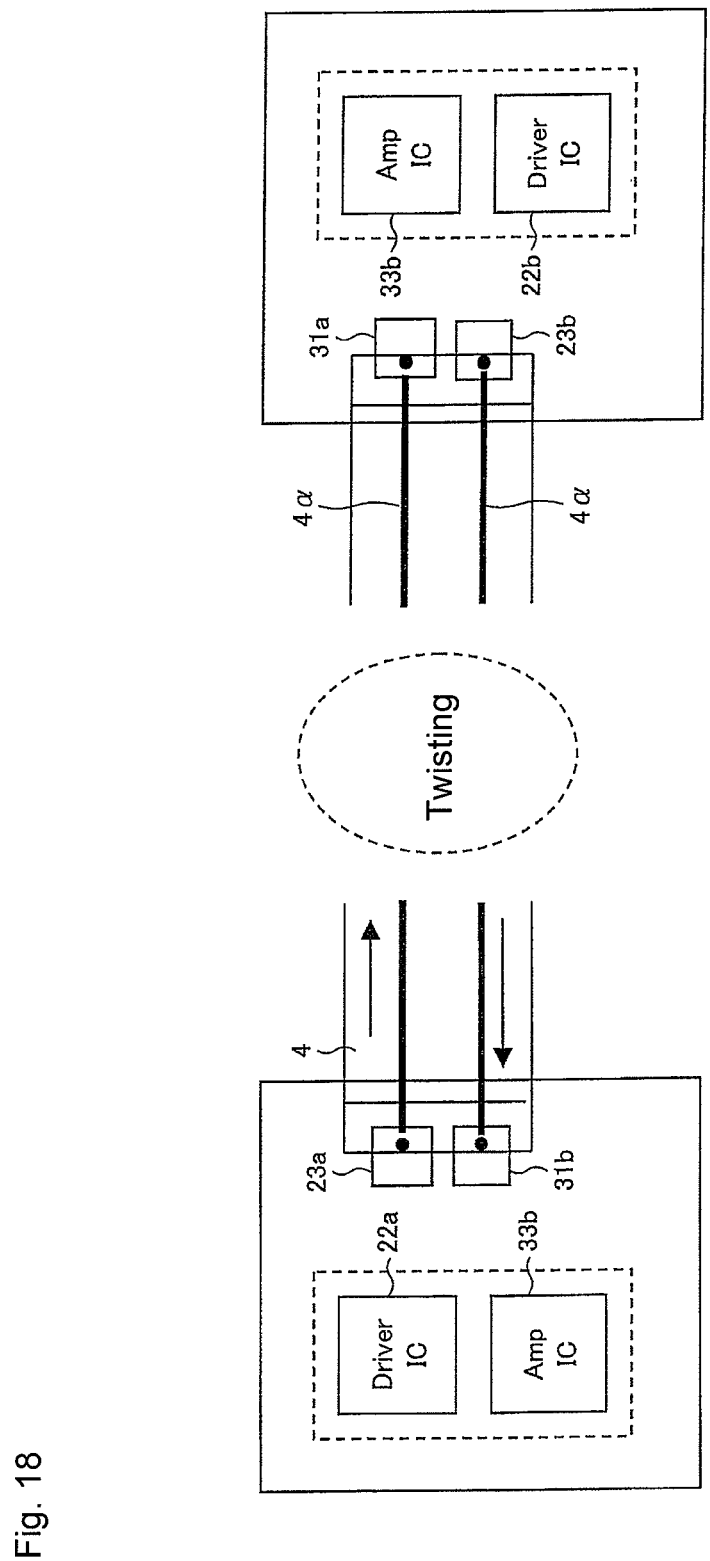
FIG. 18 is a top plan view illustrating a configuration of an optical transmission module 1 according to Modification 4.

Still another modification of the configuration of the optical transmission module 1 according to one or more embodiments of the present invention illustrated in FIGS. 1(a) and 1(b) will be described below. FIG. 18 is a top plan view illustrating a configuration of an optical transmission module 1 according to Modification 4.

In the optical transmission module 1 of Modification 4, two core portions 4α are formed in the single optical transmission path 4. The optical transmission module 1 of Modification 4 is an optical transmission module for bi-directional communication, in which the transmission directions (optical transmission direction) of the optical signals transmitted in the two core portions 4α are reversed.

As illustrated in FIG. 18, one of the two core portions 2α is optically coupled to a light emitting unit 23a and a light receiving unit 31a, and the other core portion 2α is optically coupled to a light emitting unit 23b and a light receiving unit 31b. The light emitting unit 23a and the light receiving unit 31b are mounted on the same board. The light emitting unit 23b and the light receiving unit 31a are mounted on the same board.

A light emission driving unit 22a that drives the light emission of the light emitting unit 23a and an amplifying unit 33b that amplifies the electric signal from the light receiving unit 31b to a desired value to output the electric signal to the outside are mounted on the board on which the light emitting unit 23a and the light receiving unit 31b are mounted. A light emission driving unit 22b that drives the light emission of the light emitting unit 23b and an amplifying unit 33a that amplifies the electric signal from the light receiving unit 31a to a desired value to output the electric signal to the outside are mounted on the board on which the light emitting unit 23b and the light receiving unit 31a are mounted.

Even in the above configuration of the optical transmission module 1 for the bi-directional communication, the low profile of the mobile telephone (the low profile of the sliding mechanism 41) can be realized by twisting the optical transmission path 4.

(Method for Attaching Optical Transmission Module 1 to Transmission-Side Board 20 and Reception-Side Board 30)

Next, a method for attaching the optical transmission module 1 to the external transmission-side board 20 and the external reception-side board 30 (hereinafter the two boards are collectively referred to as wiring board 15) will be described below. For example, a so-called vertical connection method can be cited as the method for attaching the optical transmission module 1 to the wiring board 15. In the vertical connection method, as illustrated in FIG. 19(a), the end portion of the optical transmission module 1 is fitted and attached to a connection retaining member 13 provided in the external wiring board 15 so as to be substantially vertical to the upper surface of the external wiring board 15. In the connector connection performed by the vertical connection method, a header 1A that is projected vertically to the optical transmission direction is provided in each of the transmission-side contact unit 2A and the reception-side contact unit 3A of the optical transmission module 1. A vertical connector recess 13A (second fitting unit) in which the header 1A is fitted is formed in the connection retaining member 13 of the external board 15. Specifically, board-to-board connector connection is cited as the connector connection performed by the vertical connection method.

Additionally, as illustrated in FIG. 22(b), a so-called horizontal connection method can be cited as the method for attaching the optical transmission module 1 to the wiring board 15. In the horizontal connection method, an end face portion of the optical transmission module 1 is slid and attached to the connection retaining member 13 provided on the external wiring board 15 so as to become substantially parallel to the upper surface of the external wiring board 15. In the connector connection performed by the horizontal connection method, a horizontal connector projection 1B projected in the optical transmission direction is provided in each of the transmission-side contact unit 2A and the reception-side contact unit 3A of the optical transmission module 1. A horizontal connector recess 13B (first fitting unit) in which the horizontal connector projection 1B is fitted is formed in the connection retaining member 13 of the external board 15. Specifically, ZIF connector connection is cited as the connector connection performed by the horizontal connection method.

Further, as illustrated in FIG. 20(c), another connector connection method can be cited as the method for attaching the optical transmission module 1 to the wiring board 15. In the connector connection method illustrated in FIG. 20(c), an end face portion of the optical transmission module 1 is attached to the external wiring board 15 with an anisotropic conductive film 13D interposed therebetween. In this connector connection method, a circuit pattern 1C (first circuit pattern) is provided in the end face portion of the optical transmission module 1, and a circuit pattern 13C (second circuit pattern) is provided in the external wiring board 15. The anisotropic conductive film 13D is provided on the circuit pattern 13C, and the circuit pattern 1C and the circuit pattern 13C are electrically connected through the anisotropic conductive film 13D. Specifically, ACF connection is cited as such a connector connection method illustrated in FIG. 20(c).

Further, as illustrated in FIG. 20(d), another connector connection method can be cited as the method for attaching the optical transmission module 1 to the wiring board 15. In the connector connection method illustrated in FIG. 20(d), the light emission driving unit 22 (or amplifying unit 33) and the light emitting unit 23 (or light receiving unit 31) are previously mounted on the external wiring board 15, and the optical transmission path 4 is connected to the wiring board 15 on which the light emission driving unit 22 and the light emitting unit 23 are mounted. In this connector connection method, the connector for electric connection is not required, so that the miniaturization and the low profile of the mobile telephone 40 can further be achieved.

APPLICATION EXAMPLE

The optical transmission module 1 according to one or more embodiments of the present invention can be applied to the following examples. In the above embodiments, the optical transmission module 1 is applied to the mobile telephone 40 as the application example. However, the present invention is not limited thereto, and the optical transmission module 1 can be applied to sliding mechanisms of sliding type electronic instruments such as a sliding type PHS (Personal Handyphone System), a sliding type PDA (Personal Digital Assistant), and a sliding type notebook personal computer.

By applying the optical transmission module 1 to the sliding type electronic instruments, the high-speed, large-capacity communication can be realized in the limited space. Accordingly, the optical transmission module 1 is particularly suitable to devices such as a sliding type liquid crystal display device in which the high-speed, large-capacity communication and downsizing are required.

Further, the optical transmission module 1 can also be applied to driving-unit-equipped devices such as a printer head in a printing device (electronic instrument) and a read unit in a hard-disk recording and reproducing device.

FIGS. 20(a) to 20(c) illustrate examples in which the optical transmission module 1 is applied to a printing device 50. FIG. 20(a) is a perspective view illustrating an appearance of the printing device 50. As illustrated in FIG. 20(a), the printing device 50 includes a printer head 51 that performs printing to a sheet 54 while moving in a width direction of the sheet 54, and one end of the optical transmission module 1 is connected to the printer head 51.

FIG. 20(b) is a block diagram illustrating a main part to which the optical transmission module 1 is applied in the printing device 50. As illustrated in FIG. 20(b), one end portion of the optical transmission module 1 is connected to the printer head 51, and the other end portion is connected to a main-body-side board in the printing device 50. Control means for controlling an operation of each unit of the printing device 50 is provided in the main-body-side board.

FIGS. 20(c) and 20(d) are perspective views illustrating a curved state of the optical transmission path 4 when the printer head 51 is moved (driven) in the printing device 50. As illustrated in FIGS. 20(c) and 20(d), when the optical transmission path 4 is applied to the driving unit such as the printer head 51, each position of the optical transmission path 4 is repeatedly bent while the curved state of the optical transmission path 4 changes by driving the printer head 51.

Accordingly, the optical transmission module 1 according to one or more embodiments of the present invention is suitable to the driving unit. By applying the optical transmission module 1 to the driving unit, the high-speed, large-capacity communication using the driving unit can be realized.

Figure 21:
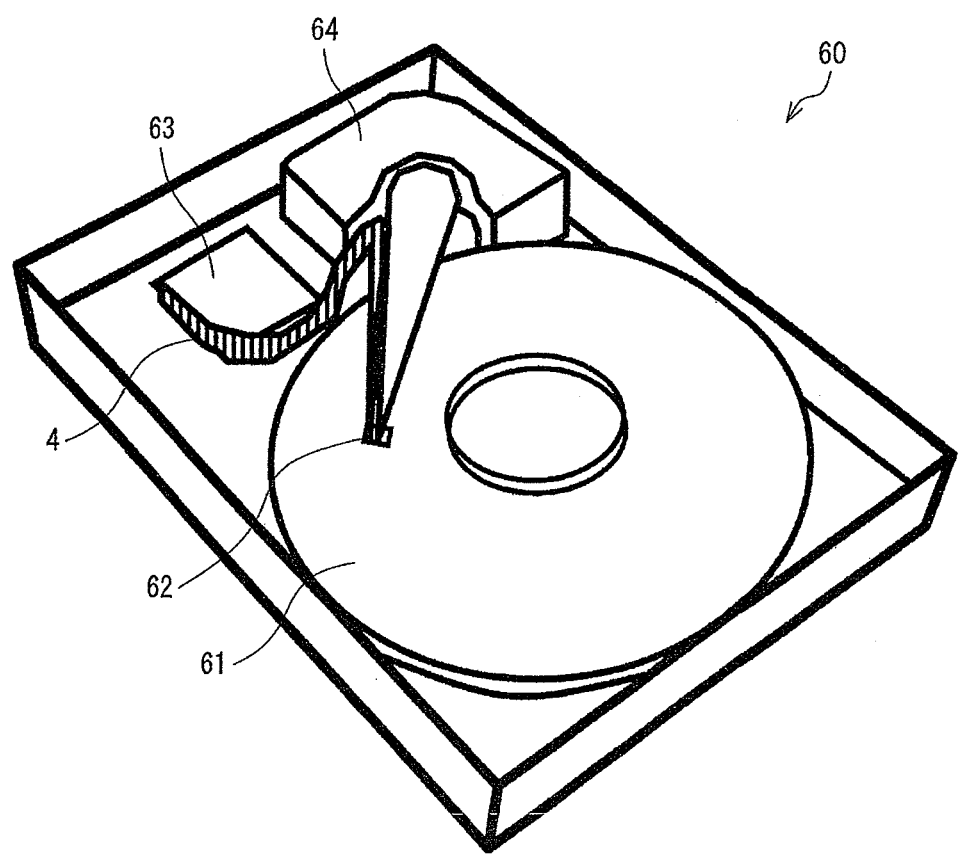
FIG. 21 is a perspective view illustrating an appearance of a hard disk recording and reproducing device provided with the optical transmission module according to one or more embodiments of the present invention.
Figure 22:
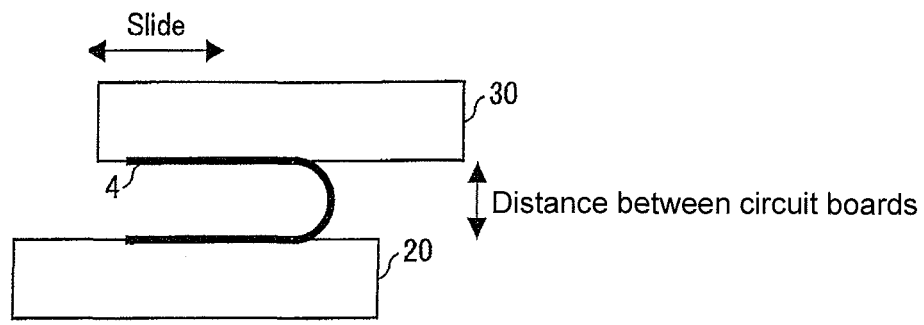

FIG. 21 illustrates an example in which the optical transmission module 1 is applied to a hard disk recording and reproducing device 60.

As illustrated in FIG. 21, the hard disk recording and reproducing device 60 includes a disk (hard disk) 61, a head (write and read head) 62, a board introducing unit 63, a driving unit (driving motor) 64, and the optical transmission module 1.

The driving unit 64 drives the head 62 along a radial direction of the disk 61. The head 62 reads information recorded in the disk 61 and the head 62 writes information in the disk 61. The head 62 is connected to the board introducing unit 63 through the optical transmission module 1, the head 62 propagates the information read from the disk 61 as the optical signal to the board introducing unit 63, and the head 62 receives the optical signal of the information that is propagated from the board introducing unit 63 and written in the disk 61.

Thus, the optical transmission module 1 is applied to the driving unit such as the head 62 in the hard disk recording and reproducing device 60, which allows the high-speed, large-capacity communication to be realized.

In addition to the above-described application examples, the optical transmission module 1 according to one or more embodiments of the present invention can be applied to information terminals such as a video camera and a notebook personal computer and signal transmission between the boards.

One or more embodiments of the present invention will be described in detail by an example. Obviously, the present invention is not limited to the following example, but various modes can be made in detail. Further, the present invention is not limited to the above-described embodiments, and various changes can be made without departing from the scope of claims.

Example 1

A sliding test was performed in order to examine the effect of the optical transmission module 1 according to one or more embodiments of the present invention. In the sliding test, a configuration (hereinafter referred to as U-shaped bending configuration) in which the optical transmission path 4 is bent into the U-shape between the transmission-side board 20 and the reception-side board 30 and a configuration (hereinafter referred to as twisting-bending configuration) in which the optical transmission path 4 is twisted and bent between the transmission-side board 20 and the reception-side board 30 were used as samples. As illustrated in FIG. 22(b), for the U-shaped bending configuration and the twisting-bending configuration, while the board-to-board distance was kept constant, an appearance of the optical transmission path 4 was examined when the transmission-side board 20 and the reception-side board 30 were repeatedly slid in parallel with each other.

The sliding test was performed pursuant to a standard number JIS_C_5016. Specifically, a sliding span was set to ±5 mm, a sliding speed was set to 60 cycle/min, an inter-slide gap (board-to-board distance) was set to 1.5 mm, and the sliding test was performed in an environment of 25° C. Because the board-to-board distance was set to 1.5 mm, the optical transmission path 4 had the bending radius (outer diameter) of 0.75 mm in the U-shaped bending configuration.

FIG. 22(a) is a table illustrating result of the sliding test. As illustrated in the table of FIG. 22(a), for the U-shaped bending configuration, the sliding test was performed with five samples while the number of sliding times was set to 10,000.

As a result, the fracture of the optical transmission path (WG) was observed in all the five samples. On the other hand, for the twisting-bending configuration, the sliding test was performed with three samples while the number of sliding times was set to 25,000. As a result, the abnormal appearance was not observed in any of the three samples.

One or more embodiments of the present invention can be applied to the optical communication path between various devices, as well as to the flexible optical wiring as the wiring in the device mounted on the compact, low-profile commercial device.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF SYMBOLS 1 optical transmission module
1A header
1B horizontal connector projection
2 optical transmission unit
2A transmission-side contact unit
3 optical reception unit
3A reception-side contact unit
4 optical transmission path
4C bending portion
5 protective film (board film)
6 electric wiring (electric transmission path)
7 guide unit
13A vertical connector recess (second fitting unit)
13B horizontal connector recess (first fitting unit)
20 transmission-side board (first circuit board)
30 reception-side board (second circuit board)
40 sliding type mobile telephone (electronic instrument)
41 sliding mechanism

The invention claimed is:

1. An optical transmission module comprising:
an optical transmission path in which optical transmission is performed between a first circuit board and a second circuit board disposed opposite the first circuit board,
wherein the optical transmission path has a folded structure having a bending radius, and
wherein a board film made of a material different from a material used in the optical transmission path is provided in one of a plurality of surfaces parallel to an optical transmission direction in the optical transmission path.

2. The optical transmission module according to claim 1, comprising:
an optical transmission unit that is connected to the first circuit board; and
an optical reception unit that is connected to the second circuit board, wherein
the optical transmission path is twisted about an optical transmission direction, and
the optical transmission unit and the optical reception unit are connected to the first circuit board and the second circuit board while the optical transmission path is twisted.

3. The optical transmission module according to claim 2, wherein the optical reception unit is provided in a surface opposite to a surface in which the optical transmission unit is provided in the optical transmission path.

4. The optical transmission module according to claim 1, wherein the first circuit board and the second circuit board are relatively moved in parallel with each other.

5. The optical transmission module according to claim 1, wherein at least a width of a bending portion in the optical transmission path is smaller than a distance between the first circuit board and the second circuit board.

6. The optical transmission module according to claim 1, wherein the board film is provided in an outer surface of a circumferential portion of the optical transmission path.

7. The optical transmission module according to claim 1, comprising:
an optical transmission unit that is connected to the first circuit board; and
an optical reception unit that is connected to the second circuit board, wherein
the optical transmission unit includes a light emitting element that emits light to the optical transmission path,
the optical reception unit includes a light receiving element that receives light transmitted in the optical transmission path,
the light receiving element is disposed on a side on which the board film is provided in the optical transmission path, and the light emitting element is disposed on a side on which the board film is not provided in the optical transmission path.

8. The electronic instrument according to claim 1, comprising a sliding mechanism that relatively moves the first circuit board and the second circuit board in parallel with each other.

9. The electronic instrument according to claim 1, comprising a guide unit, which guides bending of the optical transmission path, in any one of board surfaces of the first circuit board and the second circuit board, wherein the guide unit is provided while extending in a direction perpendicular to the board surface.

10. The electronic instrument according to claim 8, wherein the optical transmission module includes:
an optical transmission unit that is connected to the first circuit board; and
an optical reception unit that is connected to the second circuit board, wherein
the electronic instrument has a closed position, an opened position, and an intermediate position, wherein
the closed position is a position at which both end portions in a direction of movement performed by the sliding mechanism are overlapped,
the opened position is a position at which the first circuit board and the second circuit board are relatively moved in parallel with each other from the closed position and one of end portions in the moving direction of the first circuit board is brought closest to the other end portion in the moving direction of the second circuit board, and
an intermediate position is a position between the closed position and the opened position, and
the optical transmission unit and the optical reception unit are disposed so as not to be overlapped with each other at any one of the closed position, the opened position, and the intermediate position when viewed from a direction normal to the first circuit board and the second circuit board.

11. The electronic instrument according to claim 10, wherein a distance between the optical transmission unit and the optical reception unit is equal to or less than twice a bending radius of the optical transmission path when viewed from a direction normal to the first circuit board and the second circuit board.

12. An optical transmission module comprising:
an optical transmission path in which optical transmission is performed between a first circuit board and a second circuit board disposed opposite the first circuit board,
wherein the optical transmission path has a folded structure having a bending radius, and
wherein the optical transmission module includes:
an optical transmission unit that is connected to the first circuit board; and
an optical reception unit that is connected to the second circuit board, horizontal connector projections that are projected in an optical transmission direction of the optical transmission path are formed in the optical transmission unit and the optical reception unit, and first fitting units that are fitted in the horizontal connector projections are formed in the first circuit board and the second circuit board.

13. An optical transmission module comprising:
an optical transmission path in which optical transmission is performed between a first circuit board and a second circuit board disposed opposite the first circuit board,
wherein the optical transmission path has a folded structure having a bending radius, and
wherein the optical transmission module includes:
an optical transmission unit that is connected to the first circuit board; and
an optical reception unit that is connected to the second circuit board,
wherein headers of perpendicular connectors that are projected perpendicular to the optical transmission direction of the optical transmission path are formed in the optical transmission unit and the optical reception unit, and second fitting units that are fitted in the headers are formed in the first circuit board and the second circuit board.

14. An optical transmission module comprising:
an optical transmission path in which optical transmission is performed between a first circuit board and a second circuit board disposed opposite the first circuit board,
wherein the optical transmission path has a folded structure having a bending radius, and
wherein the optical transmission module includes:
an optical transmission unit that is connected to the first circuit board; and
an optical reception unit that is connected to the second circuit board, wherein
first circuit patterns are formed in the optical transmission unit and the optical reception unit,
second circuit patterns are formed in the first circuit board and the second circuit board, and
the first and second circuit patterns are connected through an anisotropic conductive film.

* * * * *